United States Patent
Jeon

(10) Patent No.: US 12,426,222 B2
(45) Date of Patent: Sep. 23, 2025

(54) PRINTED CIRCUIT BOARD AND ELECTRONIC DEVICE INCLUDING THE SAME

(71) Applicant: Samsung Electronics Co., Ltd., Suwon-si (KR)

(72) Inventor: Jinhwan Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 160 days.

(21) Appl. No.: 17/974,433

(22) Filed: Oct. 26, 2022

(65) Prior Publication Data

US 2023/0130560 A1 Apr. 27, 2023

Related U.S. Application Data

(63) Continuation of application No. PCT/KR2022/016362, filed on Oct. 25, 2022.

(30) Foreign Application Priority Data

Oct. 26, 2021 (KR) .................. 10-2021-0143381
Dec. 1, 2021 (KR) .................. 10-2021-0170274

(51) Int. Cl.
*H05K 9/00* (2006.01)
*H05K 7/14* (2006.01)

(52) U.S. Cl.
CPC ......... *H05K 9/0024* (2013.01); *H05K 7/1427* (2013.01); *H05K 2201/10151* (2013.01); *H05K 2201/10159* (2013.01)

(58) Field of Classification Search
CPC ...... H05K 1/181; H05K 1/0216; H05K 1/111; H05K 1/144; H05K 7/1427;
(Continued)

(56) References Cited

U.S. PATENT DOCUMENTS 6,205,027 B1 * 3/2001 Nakajima ............ H05K 7/1454
361/679.56
7,554,185 B2 * 6/2009 Foong ................. H01L 25/0657
257/784
(Continued)

FOREIGN PATENT DOCUMENTS

JP 2005-259860 A2 9/2005
JP 2011-71827 A 4/2011
(Continued)

OTHER PUBLICATIONS

PCT International Search Report dated Feb. 2, 2023 for PCT/KR2022/016362.
(Continued)

*Primary Examiner* — Sagar Shrestha
(74) *Attorney, Agent, or Firm* — Nixon & Vanderhye P.C.

(57) ABSTRACT

An electronic device may include a housing, a first printed circuit board being disposed in the housing and including a receiving space formed in at least a portion thereof, and a second printed circuit board being stacked (directly or indirectly) on at least a partial area of the first printed circuit board, the second printed circuit board including a first surface including a plurality of pads configured to be electrically connected with the first printed circuit board and a second surface facing in a direction opposite to the first surface. Other various embodiments are possible.

17 Claims, 12 Drawing Sheets

(58) Field of Classification Search
CPC .......... H05K 2201/10151; H05K 2201/10159; H05K 1/11; H05K 2201/09063; H05K 9/0024; H05K 9/0081
See application file for complete search history.

(56) References Cited

U.S. PATENT DOCUMENTS

| | | | | |
|---|---|---|---|---|
| 8,018,731 | B2* | 9/2011 | Sakurai | H05K 1/141 361/728 |
| 8,976,540 | B2 | 3/2015 | Yoo | |
| 10,653,046 | B2 | 5/2020 | Hong | |
| 11,452,246 | B2* | 9/2022 | Paynter | H01L 23/5389 |
| 2001/0009342 | A1* | 7/2001 | Furukawa | H01L 23/13 257/E23.128 |
| 2001/0019477 | A1* | 9/2001 | Murasawa | H05K 9/0037 361/816 |
| 2003/0071349 | A1 | 4/2003 | Hirose | |
| 2004/0212068 | A1* | 10/2004 | Wang | H01L 24/49 257/E25.013 |
| 2007/0127725 | A1* | 6/2007 | Tominaga | H05K 1/141 381/2 |
| 2008/0024979 | A1* | 1/2008 | Ye | H05K 7/20154 361/691 |
| 2010/0237483 | A1* | 9/2010 | Chi | H01L 25/105 257/E23.116 |
| 2012/0243195 | A1 | 9/2012 | Lim et al. | |
| 2013/0077252 | A1* | 3/2013 | Ju | H05K 1/141 361/803 |
| 2015/0022986 | A1* | 1/2015 | Steuer | H05K 5/0017 361/767 |
| 2015/0195913 | A1* | 7/2015 | Cho | H05K 1/181 361/736 |
| 2015/0342051 | A1 | 11/2015 | Yu | |
| 2015/0364428 | A1* | 12/2015 | Hayashiyama | H05K 1/141 257/659 |
| 2016/0329774 | A1* | 11/2016 | Araki | H02K 11/25 |
| 2018/0035528 | A1* | 2/2018 | Kim | H05K 9/0033 |
| 2019/0037683 | A1* | 1/2019 | Han | G06F 1/1656 |
| 2019/0289758 | A1* | 9/2019 | Furuya | H05K 5/065 |
| 2019/0387649 | A1* | 12/2019 | Hong | H04M 1/0277 |
| 2020/0035589 | A1 | 1/2020 | Lee et al. | |
| 2020/0258841 | A1* | 8/2020 | Kim | H01L 23/5385 |
| 2020/0413530 | A1* | 12/2020 | Lee | H05K 1/0243 |
| 2021/0014971 | A1 | 1/2021 | Wang et al. | |
| 2021/0083156 | A1* | 3/2021 | Su | H01L 33/58 |
| 2021/0112659 | A1 | 4/2021 | Park et al. | |
| 2021/0144856 | A1 | 5/2021 | Park et al. | |
| 2021/0234950 | A1* | 7/2021 | Hong | H01R 12/57 |
| 2021/0296264 | A1* | 9/2021 | Kubo | H01L 23/60 |
| 2022/0369453 | A1* | 11/2022 | Oshima | H01L 25/07 |
| 2023/0413440 | A1* | 12/2023 | Lai | H05K 1/181 |

FOREIGN PATENT DOCUMENTS

| | | |
|---|---|---|
| KR | 10-2006-0105382 A | 10/2006 |
| KR | 10-2007-0060019 A | 6/2007 |
| KR | 10-2010-0011324 A | 2/2010 |
| KR | 10-2012-0108827 | 10/2012 |
| KR | 10-2012-0108827 A | 10/2012 |
| KR | 10-2015-0002200 A | 1/2015 |
| KR | 10-2015-0134696 | 12/2015 |
| KR | 10-2019-0135811 | 12/2019 |
| KR | 10-2020-0011169 | 2/2020 |
| WO | WO 2021-008592 A1 | 1/2021 |

OTHER PUBLICATIONS

PCT Written Opinion dated Feb. 2, 2023 for PCT/KR2022/016362.
Extended European Search Report dated Jan. 2, 2025 for EP Application No. 22887563.9.

* cited by examiner

PRINTED CIRCUIT BOARD AND ELECTRONIC DEVICE INCLUDING THE SAME

CROSS-REFERENCE TO RELATED APPLICATIONS

This application is a continuation application, claiming priority under § 365(c), of an International application No. PCT/KR2022/016362, filed on Oct. 25, 2022, which is based on and claims the benefit of a Korean patent application number 10-2021-0143381, filed on Oct. 26, 2021, in the Korean Intellectual Property Office, and of a Korean patent application number 10-2021-0170274, filed on Dec. 1, 2021, in the Korean Intellectual Property Office, the disclosures of all of which are incorporated by reference herein in their entireties.

BACKGROUND

Field

Various embodiments of the disclosure relate to an electronic device, e.g., a printed circuit board and/or an electronic device including the same.

Description of Related Art

Advancing information communication and semiconductor technologies accelerate the spread and use of various electronic devices. Electronic devices are being developed to carry out communication while carried on.

The term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is being equipped with various functions. For example, an electronic device comes with the integrated functionality, including an entertainment function, such as playing video games, a multimedia function, such as replaying music/videos, a communication and security function for mobile banking, and a scheduling or e-wallet function. Such electronic devices become compact enough for users to carry in a convenient way.

Due to the recent demand for high integration and performance for more compactness and slimness and application of state-of-the-art technology related to antennas for portable electronic devices, e.g., smartphones, the space for the printed circuit board inside the electronic device decreases but the space for components increases due to addition of various features.

An electronic device (e.g., a smart phone or a tablet PC) may include electrical components having various functions and a printed circuit board having the components mounted thereon or electrically connected with electrical components. The electrical components and the printed circuit board may occupy a certain space in the limited inner space of the electronic device.

As the electronic device may include various electrical components, the required area for the printed circuit board for mounting various electrical components on the printed circuit board or electrically connecting the electronic devices to the printed circuit board trends to increase. Increasing the size (or area) of the printed circuit board to address the issue may be a drawback to electronic devices required to be downsized or slimmed. Another method is suggested which uses a high-integration, high-specification printed circuit board, but this is disadvantageous in light of manufacturing costs of the electronic device.

SUMMARY

According to various example embodiments of the disclosure, there may be provided a printed circuit board and an electronic device including the same, which provide a merit in terms of manufacturing costs of the electronic device by mounting on different printed circuit boards, and/or electrically connecting to the printed circuit boards, electrical components requiring a high-specification printed circuit board and electrical components requiring a relatively low-specification printed circuit board.

The disclosure is not limited to the foregoing embodiments but various modifications or changes may rather be made thereto without departing from the spirit and scope of the disclosure.

According to various example embodiments of the disclosure, an electronic device may comprise a housing, a first printed circuit board being disposed in the housing and including a receiving space formed in at least a portion thereof, and a second printed circuit board being stacked (directly or indirectly) on at least a partial area of the first printed circuit board, the second printed circuit board including a first surface including a plurality of pads configured to be electrically connected with the first printed circuit board and a second surface facing in a direction opposite to the first surface.

According to various example embodiments of the disclosure, a printed circuit board may comprise a first surface including a plurality of pads configured to be electrically connected with another printed circuit board and a second surface facing in a direction opposite to the first surface, a processor being disposed on the first surface, and a temperature detection unit being disposed adjacent to the processor on the first surface, wherein the temperature detection unit includes a first portion and a second portion disposed to be substantially perpendicular to the first portion, wherein the second portion is longer than the first portion, and wherein the second portion is disposed adjacent to the processor.

According to various example embodiments of the disclosure, it is possible to reduce the manufacturing costs of the electronic device by mounting on different printed circuit boards, and/or electrically connecting to the printed circuit boards, electrical components requiring a high-specification printed circuit board and electrical components requiring a relatively low-specification printed circuit board.

According to various example embodiments of the disclosure, it is possible to minimize or reduce the space occupied by the electrical components and the printed circuit board by optimizing the structure and/or arrangement of the electrical components and the printed circuit board.

According to various example embodiments of the disclosure, as the printed circuit board is applicable to various types of electronic devices, compatibility may be secured.

Effects of the disclosure are not limited to the foregoing, and other unmentioned effects would be apparent to one of ordinary skill in the art from the following description.

BRIEF DESCRIPTION OF THE DRAWINGS

Certain example embodiments are illustrated in the accompanying drawings, throughout which like reference letters indicate corresponding parts in the various figures. The embodiments herein will be better understood from the following description with reference to the drawings, in which.

DETAILED DESCRIPTION

Figure 1:
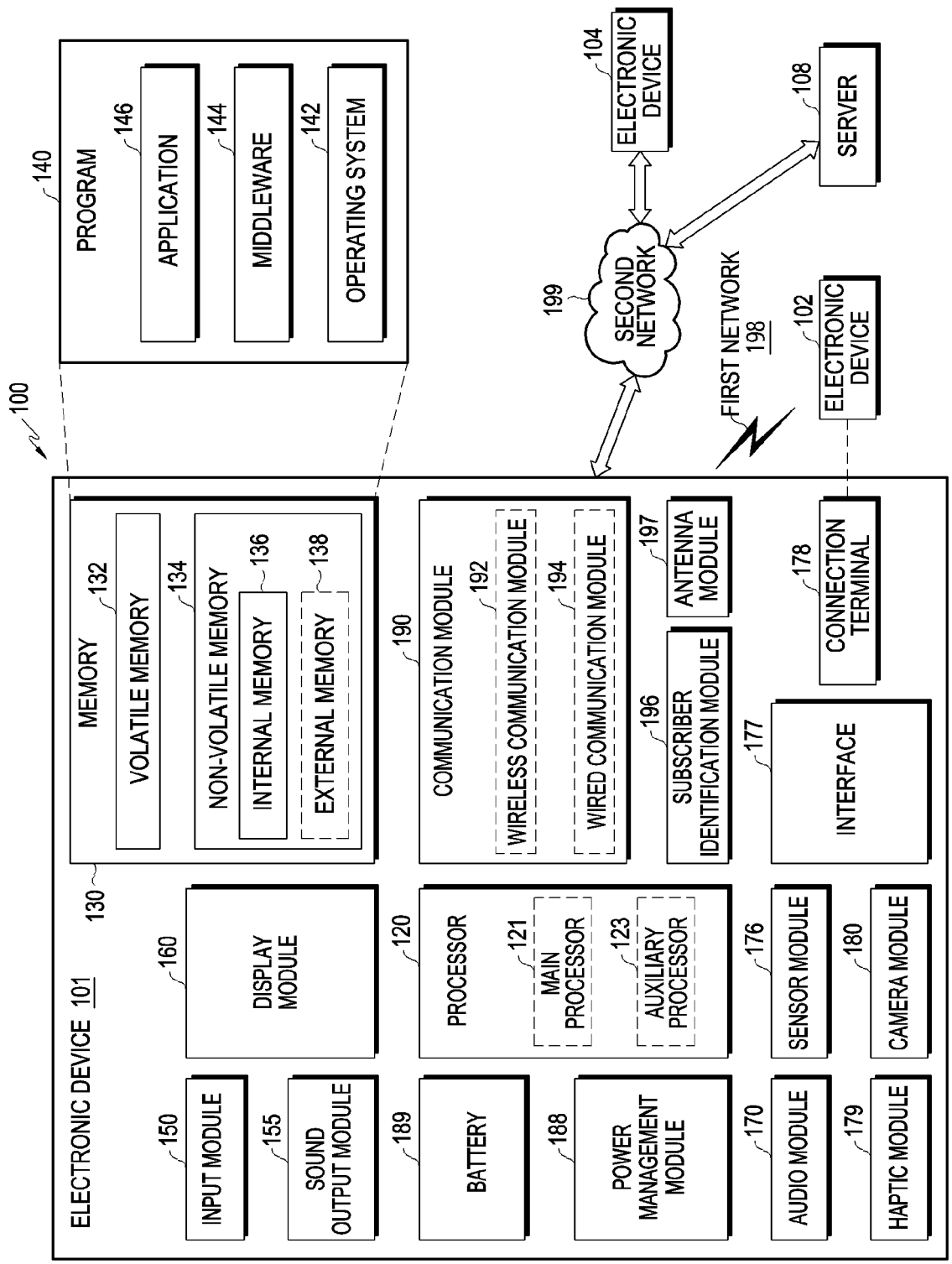
FIG. 1 is a block diagram illustrating an electronic device in a network environment according to various example embodiments.

FIG. 1 is a block diagram illustrating an electronic device 101 in a network environment 100 according to various embodiments.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via at least a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be configured to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
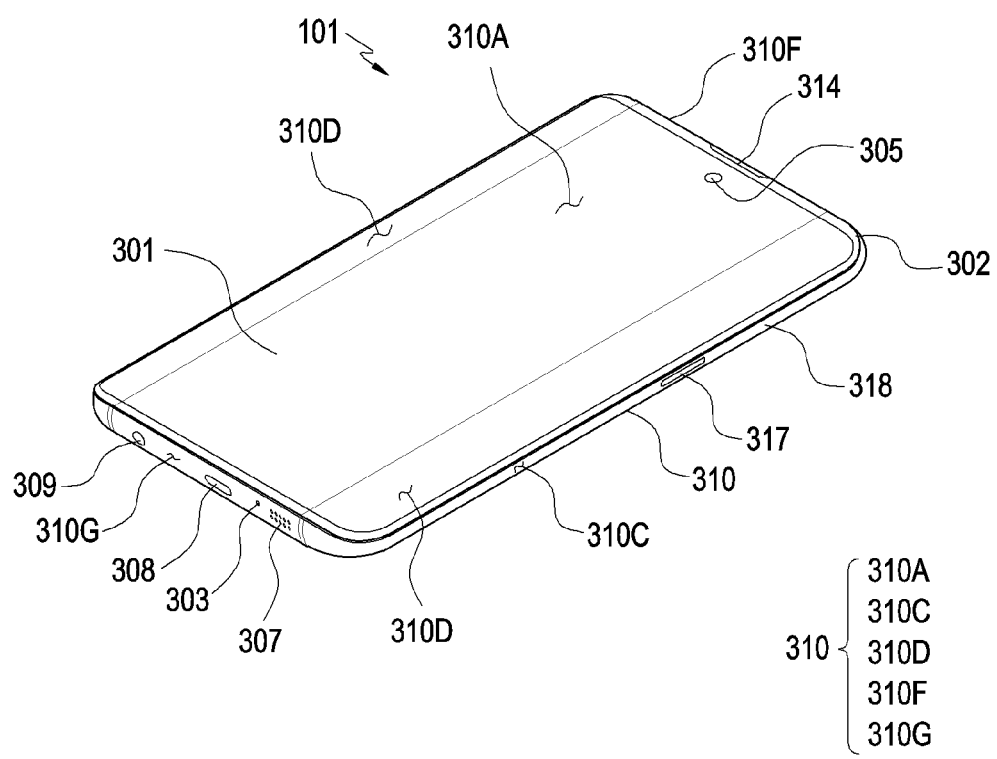
FIG. 2 is a front perspective view illustrating an electronic device according to various example embodiments of the disclosure.
Figure 3:
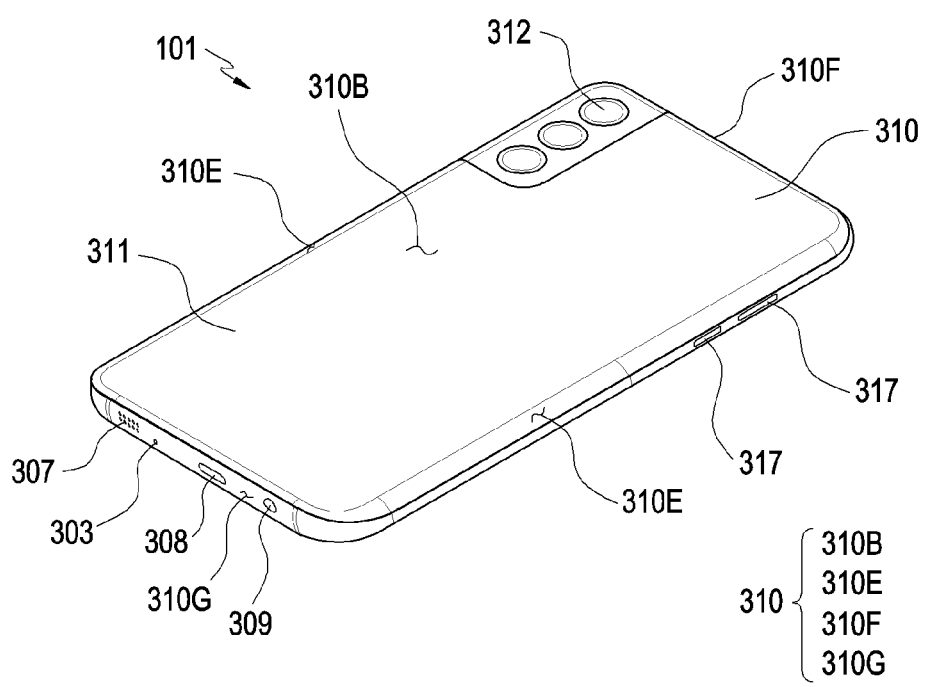
FIG. 3 is a rear perspective view illustrating an electronic device according to various example embodiments of the disclosure.

FIG. 2 is a front perspective view illustrating an electronic device according to various embodiments of the disclosure. FIG. 3 is a rear perspective view illustrating an electronic device according to various embodiments of the disclosure.

Referring to FIGS. 2 and 3, according to various embodiments, an electronic device 101 (e.g., the electronic device 101 of FIG. 1) may include a housing 310 including a front surface 310A, a rear surface 310B, and a side surface 310C surrounding a space between the front surface 310A and the rear surface 310B. According to another embodiment (not shown), the housing 310 may denote a structure forming part of the front surface 310A and side surface 310C of FIG. 2 and the rear surface 310B of FIG. 3. According to an embodiment, at least part of the front surface 310A of the housing 310 may have a substantially transparent front plate 302 (e.g., a glass plate or polymer plate including various coating layers). The rear surface 310B of the housing 310 may be formed by a rear plate 311. The side surface 310C of the housing 310 may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., glass, metal, such as aluminum, or ceramic).

In the embodiment illustrated, the front plate 302 may include two first edge areas 310D, which seamlessly and bendingly extend from the first surface 310A to the rear plate 311, on both the long edges of the front plate 302. In the embodiment (refer to FIG. 3) illustrated, the rear plate 311 may include two second edge areas 310E, which seamlessly and bendingly extend from the rear surface 310B to the front plate, on both the long edges. According to an embodiment, the front plate 302 (or the rear plate 311) may include only one of the first edge areas 310 (or the second edge areas 310E). Alternatively, the first edge areas 310D or the second edge areas 301E may partially be excluded. According to an embodiment, at side view of the electronic device 101, the side bezel structure 318 may have a first thickness (or width) for sides that do not have the first edge areas 310D or the second edge areas 310E and a second thickness, which is smaller than the first thickness, for sides that have the first edge areas 310D or the second edge areas 310E.

According to an embodiment, the display 301 (e.g., the display module 160 of FIG. 1, including a display) may be visually exposed through a significant portion of the front plate 302. According to an embodiment, at least a portion of the display 301 may be exposed through the front plate 302 forming the front surface 310A and the first edge areas 310D. According to an embodiment, the edge of the display 301 may be formed to be substantially the same in shape as an adjacent outer edge of the front plate 302. According to another embodiment (not shown), the interval between the outer edge of the display 301 and the outer edge of the front plate 302 may remain substantially even to give a larger area of exposure the display 301.

According to an embodiment, the surface (or the front plate 302) of the housing 310 may include a screen display area formed as the display 301 is visually exposed. For example, the screen display area may include the front surface 310A and first edge areas 310D.

According to an embodiment, a first side surface 310F may be disposed in one direction (e.g., the +X direction of FIG. 4) of the housing 310, and a second side surface 310G may be disposed in the other direction (e.g., −X direction of FIG. 4) of the housing 310.

According to another embodiment (not shown), a recess or opening may be formed in a portion of the screen display area (e.g., the front surface 310A or the first edge areas 310D) of the display 301, and at least one or more of the audio module 314 (e.g., the audio module 170 of FIG. 1), sensor module (not shown) (e.g., the sensor module 176 of FIG. 1), light emitting device (not shown), and camera module 305 (e.g., the camera module 180 of FIG. 1, including imaging circuitry) aligned with the recess or opening may be included. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the key input device 317 may be disposed in the first edge areas 310D and/or the second edge areas 310E. Each "module" herein may comprise circuitry.

According to various embodiments, the first camera module 305 among the camera modules 305 and 312 (e.g., the camera module 180 of FIG. 1) and/or the sensor module may be disposed, in the internal space of the electronic device, to abut the external environment through the transmissive area of the display 301. According to an embodiment, the area facing the first camera module 305 of the display 301 may be formed as a transmissive area having a designated transmittance, as a part of the area displaying content. According to an embodiment, the transmissive area may be formed to have a transmittance in a range from about 5% to about 20%. The transmissive area may include an area overlapping an effective area (e.g., an angle-of-view area) of the first camera module 305 through which light incident on the image sensor to generate an image passes. For example, the transmissive area of the display 301 may include an area having a lower pixel density and/or wiring density than the surrounding area. For example, the transmissive area may replace a recess or opening. Each camera module herein may include an imaging sensor and/or imaging circuitry.

According to an embodiment, the audio modules 303, 307, and 314 (e.g., the audio module 170 of FIG. 1) may include, e.g., a microphone hole 303 and speaker holes 307 and 314. The microphone hole 303 may have a microphone inside to obtain external sounds. According to an embodiment, there may be a plurality of microphones to detect the direction of a sound. The speaker holes 307 and 314 may include an external speaker hole 307 and a phone receiver hole 314. According to an embodiment, the speaker holes 307 and 314 and the microphone hole 303 may be implemented as a single hole, or speakers may be rested without the speaker holes 307 and 314 (e.g., piezo speakers). The audio modules 303, 307, and 314 are not limited to the above-described structure. Depending on the structure of the electronic device 101, various design changes may be made (e.g., only some of the audio modules may be mounted, or a new audio module may be added).

According to an embodiment, the sensor modules (not shown) may generate an electrical signal or data value corresponding to an internal operating state or external environmental state of the electronic device 101. The sensor modules (not shown) may include a first sensor module (e.g., a proximity sensor) and/or a second sensor module (e.g., a fingerprint sensor) disposed on the front surface 310A of the housing 310 and/or a third sensor module (e.g., an HRM sensor) and/or a fourth sensor module (e.g., a fingerprint sensor) disposed on the rear surface 310B of the housing 310. In an embodiment (not shown), the fingerprint sensor may be disposed on the rear surface 310B as well as on the front surface 310A (e.g., the display 301) of the housing 310. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure. Depending on the structure of the electronic device 101, various design changes may be made (e.g., only some of the sensor modules may be mounted, or a new sensor module may be added). Each sensor module herein may include at least one sensor.

According to an embodiment, the camera modules 305 and 312 may include a first camera module 305 disposed on the front surface 310A of the electronic device 101, and a rear camera device 312 and/or a flash (not shown) disposed on the rear surface 310B. The camera modules 305 and 312 may include one or more lenses, an image sensor, and/or an image signal processor. The flash (not shown) may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101. The camera modules 305 and 312 are not limited to the above-described structure. Depending on the structure of the electronic device 101, various design changes may be made (e.g., only some of the camera modules may be mounted, or a new module may be added).

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the camera modules 305 and 312 may form, for example, a wide-angle camera and at least another of the plurality of camera modules may form a telephoto camera. Similarly, at least one of the camera modules 305 and 312 may form, for example, a front camera and at least another of the plurality of camera modules may form a rear camera. Further, the camera modules 305 and 312 may include at least one of a wide-angle camera, a telephoto camera, and an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the key input device 317 may be disposed on the side surface 310C of the housing 310. According to another embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module disposed on the rear surface 310B of the housing 310.

According to an embodiment, the light emitting device may be disposed on, e.g., the front surface 310A of the housing 310. The light emitting device (not shown) may provide, e.g., information about the state of the electronic device 101 in the form of light. According to another embodiment, the light emitting device (not shown) may provide a light source that interacts with, e.g., the first camera module 305. The light emitting device (not shown) may include, e.g., a light emitting diode (LED), an infrared (IR) LED, and/or a xenon lamp.

According to an embodiment, the connector holes 308 and 309 may include, e.g., a first connector hole 308 for receiving a connector (e.g., a USB connector) for transmitting or receiving power and/or data to/from an external electronic device (not shown) (e.g., the external electronic device 102 of FIG. 1) and/or a second connector hole 309 for receiving a connector (e.g., an earphone jack) for transmitting or receiving audio signals to/from the external electronic device.

According to an embodiment, the first camera module 305 and/or some of the sensor modules (not shown) may be disposed to be exposed to the outside through at least a portion of the display 301. For example, the first camera module 305 may include a punch hole camera disposed inside a hole or recess formed in the rear surface (e.g., the surface facing the inside of the electronic device 101) of the display 301. According to an embodiment, the second camera module 312 may be disposed inside the housing 310 so that the lens is exposed to the rear surface 310B of the electronic device 101. For example, the second camera module 312 may be disposed on a printed circuit board (not shown) (e.g., the printed circuit board 340 of FIG. 4).

According to an embodiment, the first camera module 305 and/or the sensor module may be disposed to contact the external environment through a transparent area from the internal space of the electronic device 101 to the front plate 302 of the display 301. Further, some sensor module may be disposed to perform its functions without being visually exposed through the front plate 302 in the internal space of the electronic device.

Each embodiment herein may be used in combination with any other embodiment(s) herein.

Figure 4:
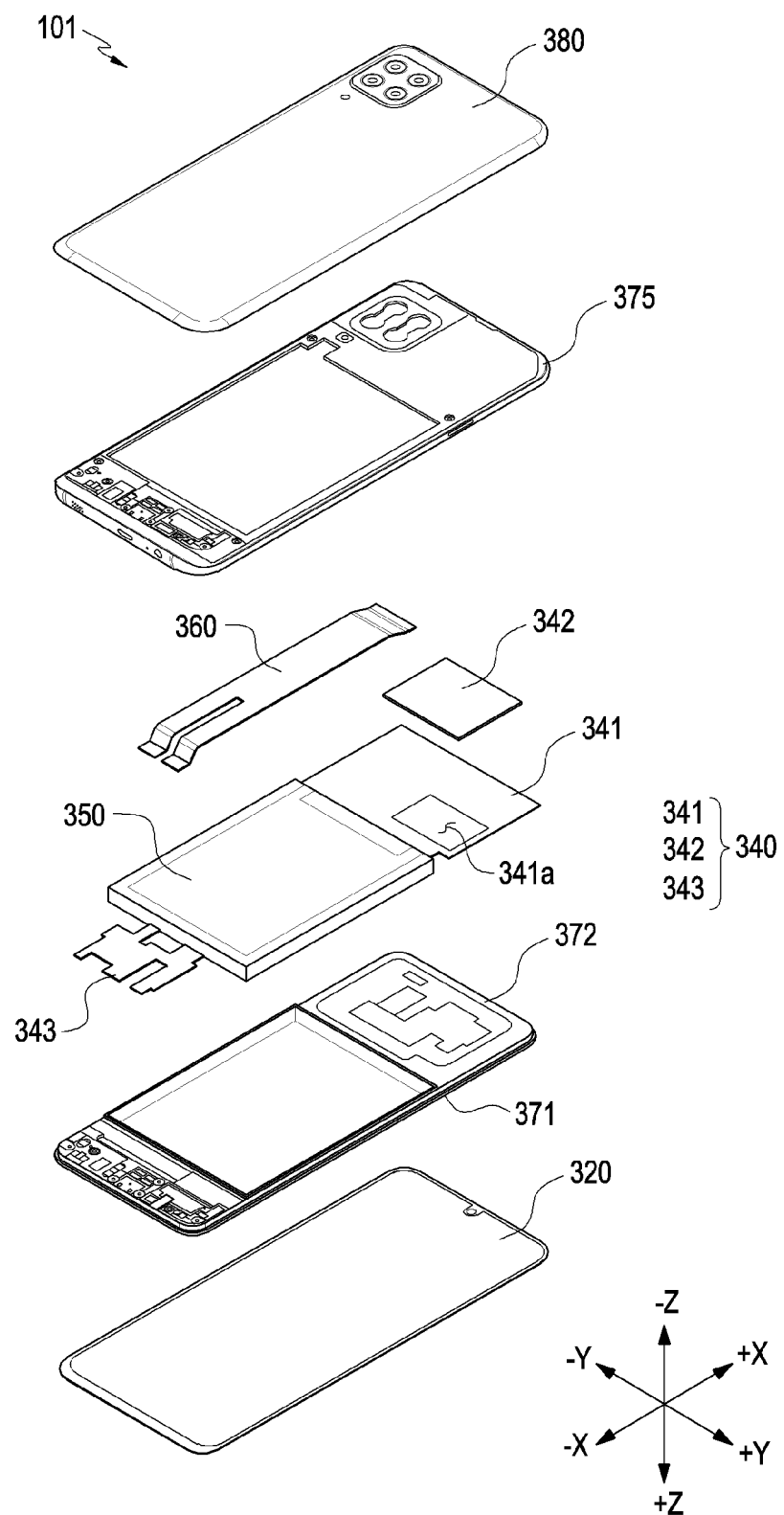
FIG. 4 is an exploded perspective view illustrating an electronic device according to various example embodiments of the disclosure.

FIG. 4 is an exploded perspective view illustrating an electronic device according to various embodiments of the disclosure.

Hereinafter, for convenience of description, in FIG. 4, the direction from the rear plate 380 to the front plate 320 may be defined and/or interpreted as a +Z direction, the direction from the front plate 320 to the rear plate 380, as a −Z direction, the direction from the third printed circuit board 343 to the first printed circuit board 341 as a +X direction, the direction from the first printed circuit board 341 to the third printed circuit board 343 as a −X direction, any one of directions perpendicular to the plane formed by the X axis and the Z axis with respect to the battery 350 as a +Y direction, and another one of the directions perpendicular to the plane formed by the X axis and the Z axis with respect to the battery 350 as a −Y direction. For example, the X axis direction may be defined and/or interpreted as the length direction of the electronic device 101 and the components of the electronic device 101, the Y axis direction may be defined and/or interpreted as the width direction of the electronic device 101 and the components of the electronic device 101, and the Z axis direction may be defined and/or interpreted as the height and/or thickness direction of the electronic device 101 and the components of the electronic device 101.

The configuration of the front plate 320 and/or the rear plate 380 of FIG. 4 may be identical in whole or part to the configuration of the front plate 302 and/or the rear plate 311 of FIGS. 2 and 3.

Referring to FIG. 4, according to various embodiments, an electronic device 101 (e.g., the electronic device 101 of FIG. 1) may include a first supporting member 372, a front plate 320 (e.g., the front plate 302 of FIG. 2), a printed circuit board 340 (e.g., printed circuit board (PCB), flexible PCB (FPCB), or rigid flexible PCB (RFPCB)), a battery 350 (e.g., the battery 189 of FIG. 1), a flexible printed circuit board 360, a second supporting member 375 (e.g., rear case), and/or a rear plate 380 (e.g., the rear plate 311 of FIG. 3). According to an embodiment, the first supporting member 372 of the electronic device 101 may include a side bezel structure 371 (e.g., the side bezel structure 318 of FIG. 2).

According to an embodiment, the electronic device 101 may exclude any one (e.g., the first supporting member 372 or the second supporting member 375) of the components or may add other components. At least one of the components of the electronic device 101 may be the same or similar to at least one of the components of the electronic device 101 of FIGS. 1 to 3 and no duplicate description may be made below.

According to various embodiments, the first supporting member 372 may be disposed in the electronic device 101 to be connected with the side bezel structure 371 (e.g., the side bezel structure 318 of FIG. 2) or be integrally formed with the side bezel structure 371. For example, the first supporting member 372 may be formed of a metal and/or non-metallic material (e.g., polymer). According to an embodiment, a display (not shown) (e.g., the display 301 of FIG. 2) may be coupled to one surface of the first supporting member 372, and at least a portion of the circuit board 340 may be coupled to the other surface.

According to various embodiments, the printed circuit board 340 may have a processor (not shown) (e.g., the processor 120 of FIG. 1), a memory (not shown) (e.g., the memory 130 of FIG. 1) and/or an interface (not shown) (e.g., the interface 177 of FIG. 1) mounted thereon or be electrically connected with the above-described components. For example, the processor may include one or more of a central processing unit, an application processor, a graphic processing device, an image signal processing, a sensor hub processor, or a communication processor. According to various embodiments, the printed circuit board 340 may include a flexible printed circuit board type radio frequency cable (FRC). For example, at least a portion of the printed circuit board 340 may be disposed on the first supporting member 372 and may be electrically connected with an antenna module (not shown) (e.g., the antenna module 197 of FIG. 1) and a communication module (not shown) (e.g., the communication module 190 of FIG. 1). According to an embodiment, the printed circuit board 340 may include a first printed circuit board 341, a second printed circuit board 342, and/or a third printed circuit board 343. According to another embodiment (not shown), the printed circuit board 340 may not include the third printed circuit board 343 or may include an additional printed circuit board (not shown). According to an embodiment, the first printed circuit board 341, the second printed circuit board 342 and/or the third printed circuit board 343 may be disposed in a housing (e.g., the housing 310 of FIGS. 2 to 3).

According to an embodiment, the memory may include a volatile memory (not shown) (e.g., the volatile memory 132 of FIG. 1) or a non-volatile memory (not shown) (e.g., the non-volatile memory 134 of FIG. 1).

According to an embodiment, the interface may include a high definition multimedia interface (HDMI), a universal serial bus (USB) interface, a secure digital (SD) card interface, and/or an audio interface. For example, the interface may electrically and/or physically connect the electronic device 101 with an external electronic device (e.g., the external electronic device 102 of FIG. 1), and may include a USB connector, an SD card/MMC connector, and/or an audio connector.

According to various embodiments, the battery 350 may be a device for supplying power to at least one component or electrical component of the electronic device 101. The battery 350 may include a primary cell which is not rechargeable, a secondary cell which is rechargeable, or a fuel cell. According to an embodiment, the battery 350 may be integrally disposed in the electronic device 101. According to another embodiment, the battery 350 may be detachably disposed on the electronic device 101.

According to various embodiments, the second supporting member 375 (e.g., the rear case) may be disposed between the printed circuit board 340 and the antenna (not shown) (e.g., the antenna module 197 of FIG. 1). According to an embodiment, the second supporting member 375 may include one surface to which the printed circuit board 340 and/or the battery 350 are coupled and another surface to which the antenna is coupled.

According to an embodiment, the antenna may be disposed between the rear plate 380 and the battery 350. For example, the antenna may include a near-field communication (NFC) antenna, a wireless charging antenna, and/or a magnetic secure transmission (MST) antenna. For example, the antenna may perform short-range communication with an external device or may wirelessly transmit or receive power necessary for charging. According to an embodiment, an antenna structure may be formed by a portion or combination of the side bezel structure 371 and/or the first supporting member 372.

According to various embodiments, the rear plate 380 may form at least a portion of the rear surface (e.g., the rear surface 310B of FIG. 3) of the electronic device 101.

According to various embodiments, the electronic device 101 may include a flexible printed circuit board (FPCB) 360. According to an embodiment, the flexible printed circuit board 360 may electrically connect the first printed circuit board 341 and the third printed circuit board 343. According to another embodiment, the flexible printed circuit board 360 may electrically connect the second printed circuit board 342 and the third printed circuit board 343. According to another embodiment, the flexible printed circuit board 360 may electrically connect at least one of the first to third printed circuit boards 341, 342, and 343 with an electrical component (not shown) (e.g., the audio module 307 or connector hole 308 or 309 of FIG. 3).

According to various embodiments, the first printed circuit board 341 may include one surface (e.g., the surface facing in the −Z direction) facing the rear plate 380 and the other surface (e.g., the surface facing in the +Z direction) facing the front plate 320. According to an embodiment, the one surface of the first printed circuit board 341 may have a camera module (not shown) (e.g., the second camera module 312 of FIG. 3) mounted thereon or be electrically connected to a camera module. According to another embodiment, the other surface of the first printed circuit board 342 may have a camera module (not shown) (e.g., the first camera module 305 of FIG. 2) mounted thereupon or be electrically connected to the camera module.

According to various embodiments, a receiving space 341a in which an electrical component (not shown) (e.g., the processor 120 of FIG. 1) may be received, may be formed in at least one portion of the first printed circuit board 341. According to an embodiment, the receiving space 341a may be formed as an opening penetrating through one surface (e.g., the surface facing in the −Z direction) and the other surface (e.g., the surface facing in the +Z direction) of the first printed circuit board 341. According to another embodiment (not shown), the receiving space 341a may be formed as a recess depressed to an arbitrary depth from the one surface (e.g., the surface facing in the −Z direction) of the first printed circuit board 341 to the other surface (e.g., the surface facing in the +Z direction). According to another embodiment (not shown), the receiving space 341a may be formed as a recess depressed to an arbitrary depth from the other surface (e.g., the surface facing in the +Z direction) of the first printed circuit board 341 to the one surface (e.g., the surface facing in the −Z direction).

According to various embodiments, the second printed circuit board 342 may be stacked (directly or indirectly) on at least a partial area of the first printed circuit board 341. According to various embodiments, the second printed circuit board 342 may be disposed to cover the receiving space 341a at least a portion of which is formed in the first printed circuit board 341. According to various embodiments, at least one of the electrical components (not shown) (e.g., the processor 120, the memory 130, and/or the power management module 188 of FIG. 1) mounted on the second printed circuit board 342 may be received in the receiving space 341a formed in the first printed circuit board 341. According to an embodiment, the second printed circuit board 342 may be disposed on one surface (e.g., the surface facing in the −Z direction) of the first printed circuit board 341. According to another embodiment, the second printed circuit board 342 may be disposed on the other surface (e.g., the surface facing in the +Z direction) of the first printed circuit board 341.

According to an embodiment (not shown), a processor may be mounted on one surface (e.g., the surface stacked on the first printed circuit board 341) of the second printed circuit board 342, and a memory and/or power management module (e.g., power management module including power management circuitry) may be mounted on the other surface facing in the direction opposite to the one surface. According to another embodiment (not shown), the processor and/or power management module may be mounted on the one surface (e.g., the surface stacked on the first printed circuit board 341) of the second printed circuit board 342, and the memory may be mounted on the other surface facing in the direction opposite to the one surface. According to another embodiment (not shown), the electrical components (processor, memory, and/or power management module) may be mounted on the one surface of the second printed circuit board 342, and no electrical component may be mounted on the other surface facing in the direction opposite to the one surface.

According to various embodiments, the size of the second printed circuit board 342 (e.g., the size in the plane formed by the X axis and Y axis of FIG. 4) may be larger than the size of the receiving space 341a of the first printed circuit board 341 (e.g., the size in the plane formed by the X axis and Y axis of FIG. 4).

Figure 5A:
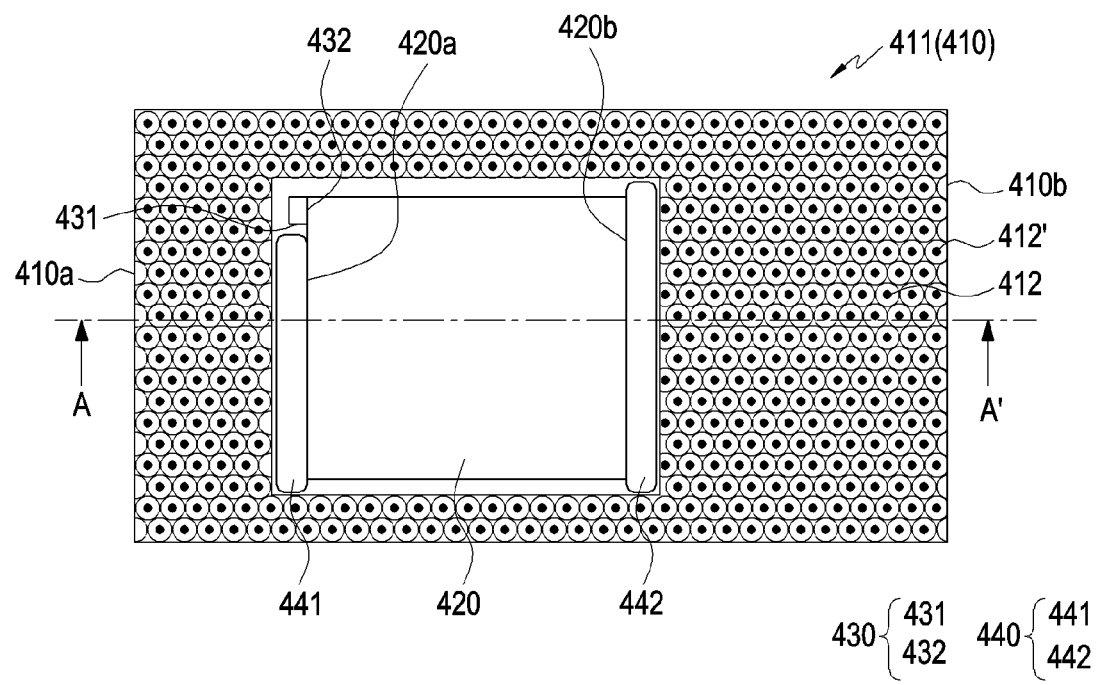
FIG. 5A is a front view illustrating a printed circuit board according to various example embodiments of the disclosure.
Figure 5B:
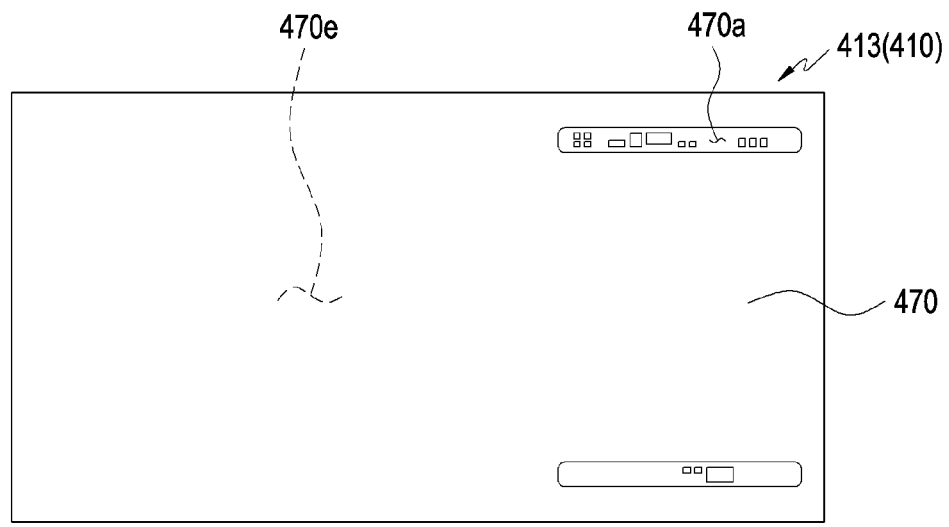
FIG. 5B is a rear view illustrating a printed circuit board according to various example embodiments of the disclosure.
Figure 5C:
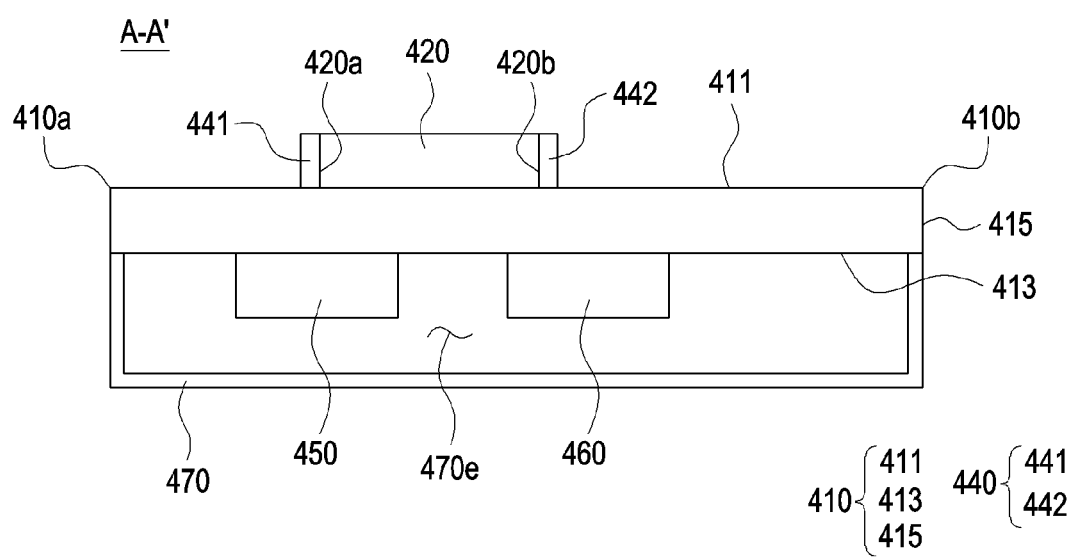
FIG. 5C is a cross-sectional view taken along line A-A' of FIG. 5A according to various example embodiments of the disclosure.

FIG. 5A is a front view illustrating a printed circuit board according to various embodiments of the disclosure. FIG. 5B is a rear view illustrating a printed circuit board according to various embodiments of the disclosure. FIG. 5C is a cross-sectional view taken along line A-A' of FIG. 5A according to various embodiments of the disclosure.

Referring to FIGS. 5A to 5C, a printed circuit board 410 may include a processor 420, a temperature detection unit 430, a resin member 440, a memory 450, a first power management module 460 (e.g., power management module including power management circuitry), and/or a first shielding member 470.

The configuration of the printed circuit board 410 of FIGS. 5A to 5C may be identical in whole or part to the configuration of the second printed circuit board 342 of FIG. 4. The configuration of the processor 420, the memory 450 and/or the first power management module 460 of FIGS. 5A to 5C may be identical in whole or part to the configuration of the processor 120, the memory 130 and/or the power management module 188 of FIG. 1. Each power management module herein may include power management circuitry.

According to various embodiments, the printed circuit board 410 (e.g., the second printed circuit board 342 of FIG. 4) may include a first surface 411 and a second surface 413 facing in the direction opposite to the first surface 411. According to an embodiment, the printed circuit board 410 may have a constant thickness between the first surface 411 and the second surface 413. According to an embodiment, the printed circuit board 410 may be provided in a rectangular shape with angled corners. According to another embodiment (not shown), the printed circuit board 410 may be provided in an overall rectangular shape with rounded corners having an arbitrary curvature. According to another embodiment (not shown), the printed circuit board 410 may be provided in a circular shape, an oval shape, a square shape, or various polygonal shapes.

According to various embodiments, the printed circuit board 410 may include a plurality of pads 412 formed on the first surface 411. According to another embodiment (not shown), the plurality of pads 412 may be formed on the second surface 413 of the printed circuit board 410. According to an embodiment, at least some of the plurality of pads 412 may be electrically and/or physically connected to a board (not shown) (e.g., the first printed circuit board 341 of FIG. 4) other than the printed circuit board 410. For example, at least some of the plurality of pads 412 of the printed circuit board 410 may be electrically and/or physically connected with at least some of the plurality of pads (or connector) (not shown) of the other board (not shown) (e.g., the first printed circuit board 341 of FIG. 4). According to an embodiment, the plurality of pads 412 may be formed on a portion, where the components (e.g., the processor 420, the temperature detection unit 430 (or the temperature detector 430), and/or the resin member 440) are not disposed or mounted, of the first surface 411 of the printed circuit board 410.

According to an embodiment, the plurality of pads 412 may include ball pads to be electrically and/or physically connected with the other printed circuit board (not shown) (e.g., the first printed circuit board 341 of FIG. 4). However, the plurality of pads 412 are not limited thereto, and various components to be electrically and/or physically connected with the other board may be included.

According to various embodiments, the plurality of pads 412 may be prepared in a plurality of horizontal rows continuously formed along the width direction (e.g., the Y axis direction of FIG. 4) of the printed circuit board 410, and the plurality of horizontal rows may be continuously arranged along the length direction (e.g., the X axis direction of FIG. 4) of the printed circuit board 410. According to an embodiment, any one of the plurality of horizontal rows and its adjacent horizontal row may be disposed so that no pads 412 are aligned in the length direction of the printed circuit board 410. For example, one pad 412 included in any one of the horizontal rows and its adjacent pad 412 among the pads 412 included in the horizontal row adjacent to any one of the horizontal rows may be disposed to be staggered with respect to the length direction of the printed circuit board 410. According to another embodiment (not shown), any one of the plurality of horizontal rows and its adjacent horizontal row may be arranged so that the pads 412 are aligned with respect to the length direction of the printed circuit board 410. For example, one pad 412 included in any one of the horizontal rows may be disposed in parallel with its adjacent pad among the pads 412 included in the horizontal row adjacent to any one of the horizontal rows, with respect to the length direction of the printed circuit board 410.

According to various embodiments, any one of the plurality of pads 412 may have a pitch of about 0.63 mm to about 0.77 mm from its adjacent pad 412. For example, the distance between the center of any one of the plurality of pads 412 and the center of its adjacent pad 412 may be about 0.63 mm to about 0.77 mm According to an embodiment, the plurality of pads 412 may have a circular shape.

According to an embodiment, the plurality of pads 412 may have a diameter of about 0.36 mm to about 0.44 mm According to another embodiment (not shown), the plurality of pads 412 may have an oval or polygonal shape.

According to various embodiments, at least some of the plurality of pads 412 of the printed circuit board 410 may be electrically connected with the ground layer of the other board (not shown) (e.g., the first printed circuit board 341 of FIG. 4). According to an embodiment, pads 412' arranged along the edge of the printed circuit board 410 among the plurality of pads 412 may be electrically connected with the ground layer of the other board.

According to an embodiment, the processor 420 (e.g., the processor 120 of FIG. 1) may be mounted or disposed on the first surface 411 of the printed circuit board 410. According to an embodiment, the processor 420 may include an application processor (AP). According to another embodiment, the processor 420 may include at least one of an application processor or a central processing unit.

According to various embodiments, the processor 420 may be disposed on an inner side of the first surface 411 of the printed circuit board 410. For example, at least a portion of the processor 420 may not be disposed adjacent to the edge of the first surface 411 of the printed circuit board 410. According to an embodiment, at least one or more horizontal rows of the plurality of pads 412 may be disposed between one edge of the processor 420 (e.g., the upper edge of the processor 420 of FIG. 5) and one edge of the printed circuit board 410 (e.g., the upper edge of the printed circuit board 410 of FIG. 5), and at least one or more horizontal rows of the plurality of pads 412 may be disposed between the other edge of the processor 420 (e.g., the lower edge of the processor 420 of FIG. 5) and the other edge of the printed circuit board 410 (e.g., the lower edge of the printed circuit board 410 of FIG. 5). According to an embodiment, at least one or more pads 412 may be disposed between an edge 420*a*, in a first direction, of the processor 420 and an edge 410*a*, in the first direction, of the printed circuit board 410, and at least one or more pads 412 may be disposed between an edge 420*b* in a second direction, which faces in the direction opposite to the first direction, of the processor 420 and an edge 410*b*, in the second direction, of the printed circuit board 410.

According to various embodiments, the temperature detection unit 430 (e.g., at least one temperature sensor) may be disposed on the first surface 411 of the printed circuit board 410. According to various embodiments, the temperature detection unit 430 may sense the temperature of the processor 420. According to an embodiment, the temperature detection unit 430 may be disposed adjacent to the processor 420. For example, the temperature detection unit 430 may be disposed to contact the processor 420. According to an embodiment, the temperature detection unit 430 may include a first portion 431 and a second portion 432 disposed substantially perpendicular to the first portion 431. According to an embodiment, the length of the second portion 432 may be substantially equal to or larger than the length of the first portion 431. According to an embodiment, the second portion 432 of the temperature detection unit 430 may be disposed adjacent to any one of the edges of the processor 420. According to another embodiment (not shown), the first portion 431 of the temperature detection unit 430 may contact or be coupled with any one of the edges of the processor 420. According to an embodiment, the temperature detection unit 430 may include a thermistor. According to another embodiment (not shown), the temperature detection unit 430 may be disposed adjacent to the processor 420 and may include various means capable of sensing the temperature of the processor 420.

According to various embodiments, at least a portion of the resin member 440 may be disposed to cover the edge of the processor 420. According to an embodiment, the resin member 440 may be disposed to cover at least a portion of the edge of the processor 420 and at least a portion of the first surface 411 of the printed circuit board 410. The resin member 440 may fix the processor 420 to the first surface 411 of the printed circuit board 410. According to an embodiment, the resin member 440 may include a first resin member 441 covering at least a portion of one edge (e.g., the edge 420a in the first direction of FIGS. 5A and 5C) of the processor 420 and/or a second resin member 442 covering at least a portion of the other edge (e.g., the edge 420b in the second direction of FIGS. 5A and 5C) of the processor 420. According to an embodiment, the first resin member 441 may be disposed to cover the one edge of the processor 420, except for the portion disposed adjacent to the temperature detection unit 430, of the one edge of the processor 420. According to another embodiment (not shown), the first resin member 441 may be disposed to cover at least a portion of the one edge (e.g., the upper edge of the processor 420 of FIG. 5) of the processor 420, and the second resin member 442 may be disposed to cover at least a portion of the other edge (e.g., the lower edge of the processor 420 of FIG. 5) of the processor 420. According to another embodiment (not shown), the resin member 440 may further include a third resin member (not shown) and/or a fourth resin member (not shown) disposed to cover at least a portion of the edge of the processor 420 in a direction different from the first resin member 441 and/or the second resin member 442. According to an embodiment, the resin member 440 may include an insulative resin. According to another embodiment, the resin member 440 may include at least one of a thermosetting resin and a thermoplastic resin. However, the resin member 440 is not limited thereto, and may include various means for fixing the processor 440 to the first surface 411 of the printed circuit board 410.

According to various embodiments, the memory 450 (e.g., the memory 130 of FIG. 1) may be mounted or disposed on the second surface 413 of the printed circuit board 410.

According to various embodiments, the first power management module 460 (e.g., the power management module 188 of FIG. 1) may be mounted or disposed on the second surface 413 of the printed circuit board 410. According to an embodiment, the first power management module 460 may be spaced apart from the memory 450 by a predetermined distance on the second surface 413.

According to various embodiments, at least a portion of the first shielding member 470 may be coupled to or disposed on the second surface 413 of the printed circuit board 410. According to another embodiment (not shown), at least a portion of the first shielding member 470 may be coupled to at least one of the first surface 411 of the printed circuit board 410 or the side surface 415 between the first surface 411 and the second surface 413. According to an embodiment, at least a portion of the first shielding member 470 may form a first shielding space 470e between it and the second surface 413 of the printed circuit board 410. At least a partial space of the first shielding space 470e may be occupied by the memory 450 and/or the first power management module 460. According to an embodiment, the first shielding member 470 may include a penetrating portion 470a connecting the first shielding space 470e and the external space of the printed circuit board 410. The heat accumulated inside the first shielding space 470e may be discharged to the external space of the printed circuit board 410 through the penetrating portion 470a. According to another embodiment (not shown), the first shielding member 470 may omit the penetrating portion 470a. According to an embodiment, the first shielding member 470 may include a shield can.

According to some embodiments (not shown), any one of the above-described electrical components may be omitted or, if necessary, additional electrical components may be disposed on the printed circuit board 410.

Figure 6:
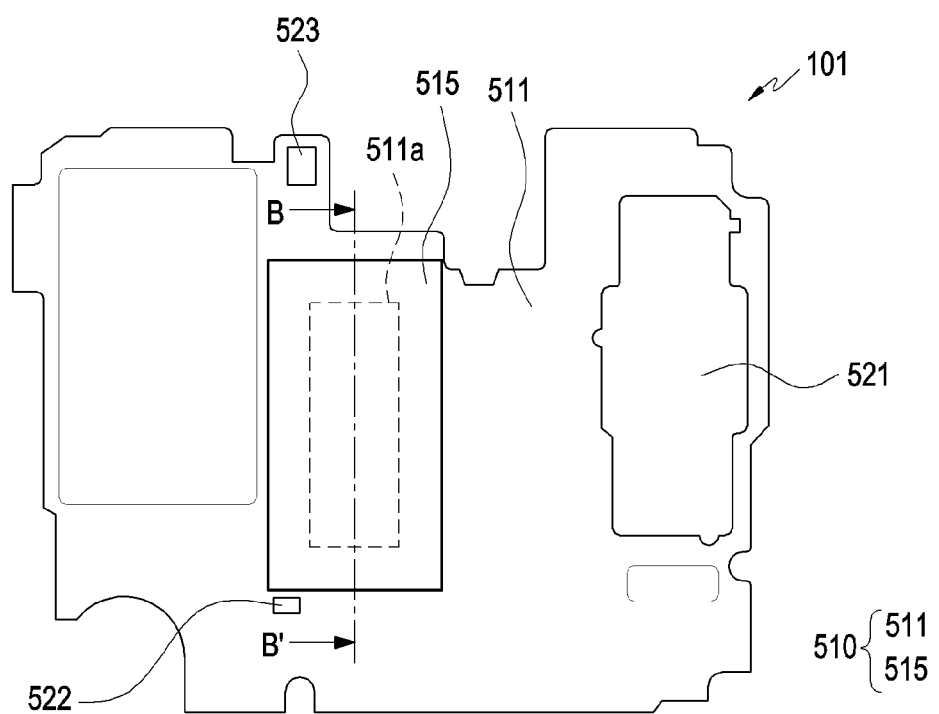
FIG. 6 is a view illustrating an arrangement relationship between a first printed circuit board and a second printed circuit board of an electronic device according to various example embodiments of the disclosure.

FIG. 6 is a view illustrating an arrangement relationship between a first printed circuit board and a second printed circuit board of an electronic device according to various embodiments of the disclosure.

According to various embodiments, the electronic device 101 (e.g., the electronic device 101 of FIGS. 1 to 4) may include a printed circuit board assembly 510, a first printed circuit board 511 of the printed circuit board assembly 510, a receiving space 511a of the first printed circuit board 511, a first electrical component 521, a second electrical component 522, a third electrical component 523, and/or a second printed circuit board 515 of the printed circuit board assembly 510.

The configuration of the printed circuit board assembly 510, the first printed circuit board 511, and/or the receiving space 511a of the first printed circuit board 511 of FIG. 6 may be identical in whole or part to the configuration of the printed circuit board 340, the first printed circuit board 341, and/or the receiving space 341a of the first printed circuit board 341 of FIG. 4. The configuration of the second printed circuit board 515 of FIG. 6 may be identical in whole or part to the configuration of the printed circuit board 342 of FIG. 4 and/or the printed circuit board 410 of FIGS. 5A to 5C.

According to various embodiments, the printed circuit board assembly 510 may include the first printed circuit board 511 and/or the second printed circuit board 515. According to an embodiment, the receiving space 511a (e.g., the receiving space 341a of FIG. 4) for receiving an electrical component (not shown) (e.g., the processor 420 disposed on the second printed circuit board 515) may be formed on at least a portion of the first printed circuit board 511 (e.g., the first printed circuit board 341 of FIG. 1). According to an embodiment, the receiving space 511a may be formed to be smaller than the second printed circuit board 515. According to an embodiment, the receiving space 511a may be covered by the second printed circuit board 515 when the first printed circuit board 511 and the second printed circuit board 515 are coupled or connected with each other.

According to various embodiments, at least a portion of the second printed circuit board 515 may be coupled or connected to the first printed circuit board 511.

According to various embodiments, the first electrical component 521 (e.g., RCAM), the second electrical component 522 (e.g., IFIC), and/or the third electrical component 523 (e.g., FCAM) may be disposed on the first printed circuit board 511. According to some embodiments (not shown), at least one of the above-described electrical components may be omitted, or additional electrical components may be disposed on the first printed circuit board 511.

According to various embodiments, the size of the second printed circuit board 515 may be larger than the size of the receiving space 511a of the first printed circuit board 511. According to an embodiment, the size on the plane of the second printed circuit board 515 may be larger than the size on the plane of the receiving space 511a.

Figure 7:
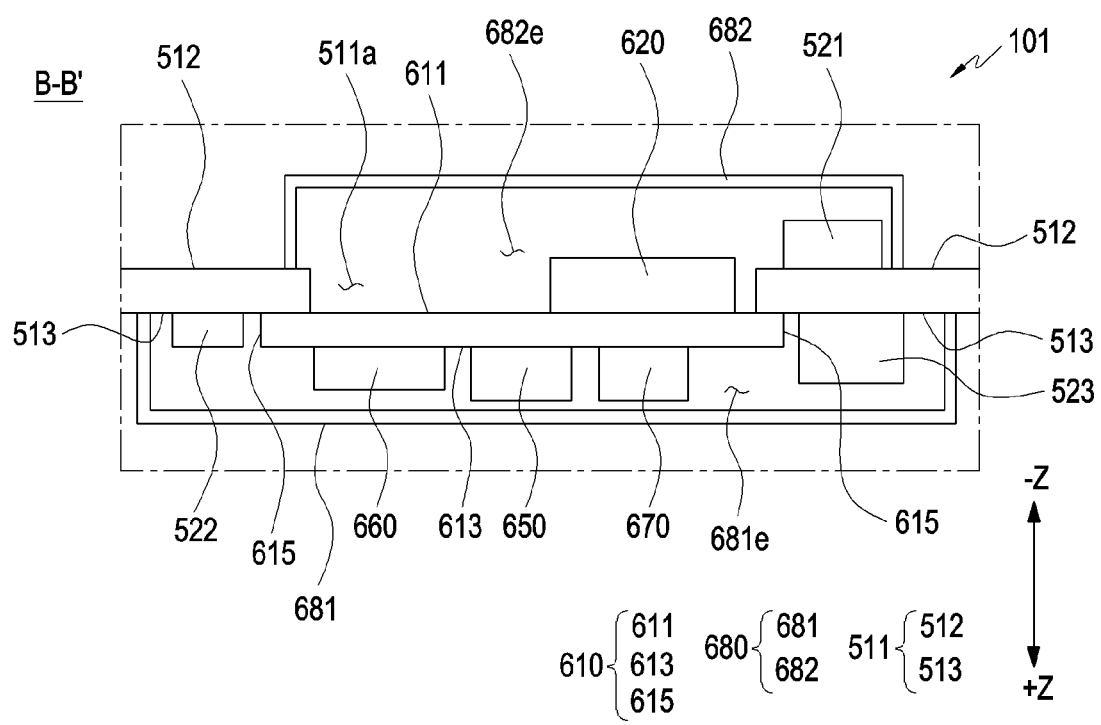
FIG. 7 is a cross-sectional view taken along line B-B' of FIG. 6 according to an example embodiment of the disclosure.

FIG. 7 is a cross-sectional view taken along line B-B' of FIG. 6 according to an embodiment of the disclosure.

Referring to FIG. 7, the electronic device 101 (e.g., the electronic device 101 of FIG. 6) may include a first printed circuit board 511, a receiving space 511a of the first printed circuit board 511, a first electrical component 521, a second electrical component 522, a third electrical component 523, a shielding member 680, a second printed circuit board 610, a processor 620, a memory 650, a first power management module 660, and/or a fourth electrical component 670.

The configuration of the first printed circuit board 511, the receiving space 511a, the first electrical component 521, the second electrical component 522, and/or the third electrical component 523 of FIG. 7 may be identical in whole or part to the configuration of the first printed circuit board 511, the receiving space 511a, the first electrical component 521, the second electrical component 522, and/or the third electrical component 523 of FIG. 6. The configuration of the second printed circuit board 610 of FIG. 7 may be identical in whole or part to the configuration of the printed circuit board 410 of FIGS. 5A to 5C and/or the second printed circuit board 515 of FIG. 6. The configuration of the processor 620, the memory 650 and/or the first power management module 660 of FIG. 7 may be identical in whole or part to the configuration of the processor 420, the memory 450 and/or the first power management module 460 of FIGS. 5A to 5C.

According to various embodiments, the first printed circuit board 511 (e.g., the first printed circuit board 511 of FIG. 6) may include a third surface 512 facing in the first direction (e.g., the −Z direction of FIG. 7) and a fourth surface 513 facing in the second direction (e.g., the +Z direction of FIG. 7) opposite to the first direction. According to various embodiments, the first printed circuit board 511 may have a receiving space 511a (e.g., the receiving space 511a of FIG. 6) for receiving the processor 620 formed in at least a portion of the first printed circuit board 511. According to an embodiment, the receiving space 511a may be prepared in a hole shape passing through the third surface 512 and the fourth surface 513 of the first printed circuit board 511. According to another embodiment (not shown), the receiving space 511a may be prepared in a recess shape depressed in the first direction (e.g., the −Z direction of FIG. 7) from the fourth surface 513 of the first printed circuit board 511.

According to various embodiments, the first electrical component 521 (e.g., the first electrical component 521 of FIG. 6), the second electrical component 522 (e.g., the second electrical component 522 of FIG. 6), and/or the third electrical component 523 (e.g., the third electrical component 523 of FIG. 6) may be disposed on the first printed circuit board 511. According to some embodiments, any one of the above-described electrical components may not be disposed or, if necessary, additional electrical components may be disposed.

According to various embodiments, the second printed circuit board 610 may include a processor 620, a memory 650, a first power management module 660, and/or a fourth electrical component 670.

According to various embodiments, the second printed circuit board 610 (e.g., the printed circuit board 410 of FIGS. 5A to 5C) may include a first surface 611 (e.g., the first surface 411 of FIGS. 5A to 5C) facing in the first direction (e.g., the −Z direction of FIG. 7), a second surface 613 (e.g., the second surface 413 of FIGS. 5A to 5C) in the second direction (e.g., the +Z direction of FIG. 7) opposite to the first direction, and/or a side surface 615 (e.g., the side surface 415 of FIGS. 5A to 5C) between the first surface 611 and the second surface.

According to an embodiment, at least a portion of the first surface 611 of the second printed circuit board 610 may be electrically and/or physically connected to the fourth surface 513 of the first printed circuit board 511. According to an embodiment, the first surface 611 of the second printed circuit board 610 may have a plurality of pads (not shown) (e.g., the plurality of pads 412 of FIGS. 5A to 5C) to be electrically and/or physically connected with the pads (or connectors) (not shown) of the first printed circuit board 511. According to another embodiment (not shown), at least a portion of the first surface 611 (e.g., the surface on which the processor 620 is mounted) of the second printed circuit board 610 may be electrically and/or physically connected to the third surface 512 of the first printed circuit board 511. According to another embodiment (not shown), at least a portion of the second surface 613 (e.g., the surface on which the memory 650 and/or the first power management module 660 is mounted) of the second printed circuit board 610 may be disposed on the third surface 512 or fourth surface 513 of the first printed circuit board 511.

According to an embodiment, the processor 620 (e.g., the processor 420 of FIGS. 5A to 5C) may be disposed on the first surface 611 of the second printed circuit board 610. According to another embodiment (not shown), the processor 620 may be disposed on the second surface 613 of the second printed circuit board 610. According to another embodiment (not shown), additional electrical components (not shown) (e.g., a thermistor) may be disposed on the first surface 611 of the second printed circuit board 610.

According to an embodiment, the memory 650 (e.g., the memory 450 of FIGS. 5A to 5C), the first power management module 660 (e.g., the first power management module 460 of FIGS. 5A to 5C), and/or the fourth electrical component 670 (e.g., application processor decapsulation) may be disposed on the second surface 613 of the second printed circuit board 610. According to another embodiment (not shown), at least one of the above-described electrical components 650, 660, and 670 may be disposed on the first surface 611 of the second printed circuit board 610. According to another embodiment (not shown), at least one of the above-described electrical components 650, 660, and 670 may be disposed on the third surface 512 or the fourth surface 513 of the first printed circuit board 511. According to another embodiment (not shown), additional electrical components (not shown) may be disposed on the second surface 613 of the second printed circuit board 610.

According to various embodiments, at least a portion of the shielding member 680 may be coupled to the first printed circuit board 511. According to an embodiment, the shielding member 680 may include a first shielding member 681 at least a portion of which is coupled to the fourth surface 513 of the first printed circuit board 511 and/or a second shielding member 682 at least a portion of which is coupled to the third surface 512 of the first printed circuit board 511.

According to an embodiment, at least a portion of the first shielding member 681, along with at least a portion of the second surface 613 of the second printed circuit board 610 and/or the fourth surface 513 of the first printed circuit board 511, may form the first shielding space 681e. At least a partial space of the first shielding space 681e may be occupied by, e.g., the second electrical component 522, the third electrical component 523, the memory 650, the first power management module 660, and/or the fourth electrical component 670.

According to some embodiment (not shown), at least a portion of the first shielding member 681 (e.g., the first shielding member 470 of FIGS. 5A to 5C) may be coupled to the second surface 613 of the second printed circuit board 610, the first shielding member 681 may form the first shielding space 681e between it and the second surface 613 of the second printed circuit board 610, at least a partial space of the first shielding space 681e may be occupied by the memory 650, the first power management module 660, and/or the fourth electrical component 670, and the first shielding member 681 may be defined and/or interpreted as a portion of the second printed circuit board 610.

According to an embodiment, at least a portion of the second shielding member 682, along with at least a portion of the first surface 611 of the second printed circuit board 610 and/or the third surface 512 of the first printed circuit board 511, may form the second shielding space 682e. At least a partial space of the second shielding space 682e may be occupied by, e.g., the first electrical component 521 and/or the processor 620.

According to some embodiments (not shown), at least a portion of the second shielding member 682 may be coupled to the first surface 611 of the second printed circuit board 610, at least a portion of the second shielding member 682 may be disposed in the receiving space 511a, the second shielding member 682 may form the second shielding space 682e between it and the first surface 611 of the second printed circuit board 610, at least a partial space of the second shielding space 682e may be occupied by the processor 620, and the second shielding member 682 may be defined and/or interpreted as a portion of the second printed circuit board 610.

According to an embodiment, at least a portion of the second shielding member 682 and/or the processor 620 may be disposed between the second printed circuit board 610 and the second shielding member (not shown) (e.g., the second supporting member 375 (e.g., rear case) of FIG. 4). For example, at least a portion of the second shielding member 682 may face the second supporting member. According to an embodiment, the memory 650, the first power management module 660, the fourth electrical component 670, and/or at least a portion of the first shielding member 681 may be disposed between the second printed circuit board 610 and the first supporting member (not shown) (e.g., the first supporting member 372 (e.g., front case) of FIG. 4). For example, at least a portion of the first shielding member 681 may face the first supporting member.

Figure 8:
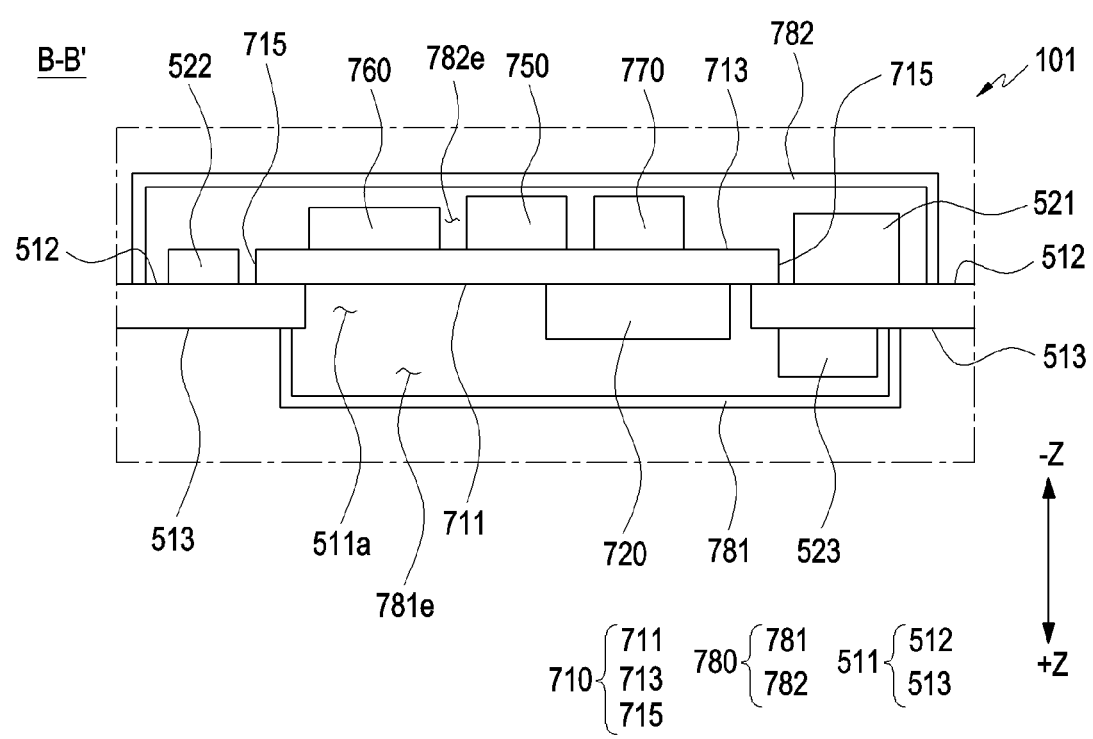
FIG. 8 is a cross-sectional view taken along line B-B' of FIG. 6 according to another example embodiment of the disclosure.

FIG. 8 is a cross-sectional view taken along line B-B' of FIG. 6 according to another embodiment of the disclosure.

Referring to FIG. 8, the electronic device 101 (e.g., the electronic device 101 of FIG. 6) may include a first printed circuit board 511, an receiving space 511a of the first printed circuit board 511, a first electrical component 521, a second electrical component 522, a third electrical component 523, a shielding member 780, a second printed circuit board 710, a processor 720, a memory 750, a first power management module 760, and/or a fourth electrical component 770.

The configuration of the first printed circuit board 511, the receiving space 511a, the first electrical component 521, the second electrical component 522, and/or the third electrical component 523 of FIG. 8 may be identical in whole or part to the configuration of the first printed circuit board 511, the receiving space 511a, the first electrical component 521, the second electrical component 522, and/or the third electrical component 523 of FIG. 6. The configuration of the second printed circuit board 710 of FIG. 8 may be identical in whole or part to the configuration of the second printed circuit board 410 of FIGS. 5A to 5C and/or the second printed circuit board 515 of FIG. 6. The configuration of the processor 720, the memory 750 and/or the first power management module 760 of FIG. 8 may be identical in whole or part to the configuration of the processor 420, the memory 450 and/or the first power management module 460 of FIGS. 5A to 5C.

According to various embodiments, the first printed circuit board 511 (e.g., the first printed circuit board 511 of FIG. 6) may include a third surface 512 facing in the first direction (e.g., the −Z direction of FIG. 7) and a fourth surface 513 facing in the second direction (e.g., the +Z direction of FIG. 7) opposite to the first direction. According to various embodiments, the first printed circuit board 511 may have a receiving space 511a (e.g., the receiving space 511a of FIG. 6) for receiving the processor 720 formed in at least a portion of the first printed circuit board 511. According to an embodiment, the receiving space 511a may be prepared in a hole shape passing through the third surface 512 and the fourth surface 513 of the first printed circuit board 511. According to another embodiment (not shown), the receiving space 511a may be prepared in a recess shape depressed in the second direction (e.g., the +Z direction of FIG. 7) from the third surface 512 of the first printed circuit board 511.

According to various embodiments, the first electrical component 521 (e.g., the first electrical component 521 of FIG. 6), the second electrical component 522 (e.g., the second electrical component 522 of FIG. 6), and/or the third electrical component 523 (e.g., the third electrical component 523 of FIG. 6) may be disposed on the first printed circuit board 511. According to some embodiments, any one of the above-described electrical components may not be disposed or, if necessary, additional electrical components may be disposed.

According to various embodiments, the second printed circuit board 710 (e.g., the second printed circuit board 410 of FIGS. 5A to 5C or the second printed circuit board 515 of FIG. 6) may include a processor 720, a memory 750, a first power management module 760, and/or a fourth electrical component 770.

According to various embodiments, the second printed circuit board 710 (e.g., the board 410 of FIGS. 5A to 5C) may include a first surface 711 (e.g., the first surface 411 of FIGS. 5A to 5C) facing in the second direction (e.g., the −Z direction of FIG. 7), a second surface 713 (e.g., the second surface 413 of FIGS. 5A to 5C) in the first direction (e.g., the +Z direction of FIG. 7) opposite to the second direction, and/or a side surface 715 (e.g., the side surface 415 of FIGS. 5A to 5C) between the first surface 711 and the second surface.

According to an embodiment, at least a portion of the first surface 711 of the second printed circuit board 710 may be electrically and/or physically connected to the third surface 512 of the first printed circuit board 511. According to an embodiment, the first surface 711 of the second printed circuit board 710 may have a plurality of pads (not shown) (e.g., the plurality of pads 412 of FIGS. 5A to 5C) to be electrically and/or physically connected with the pads (or connectors) (not shown) of the first printed circuit board 511.

According to another embodiment (not shown), at least a portion of the first surface 711 (e.g., the surface on which the processor 720 is disposed) of the second printed circuit board 710 may be electrically and/or physically connected to the fourth surface 513 of the first printed circuit board 511. According to another embodiment (not shown), at least a portion of the second surface 713 (e.g., the surface on which the memory 750 and/or the first power management module 760 is disposed) of the second printed circuit board 710 may be disposed on the third surface 512 or fourth surface 513 of the first printed circuit board 511.

According to an embodiment, the processor 720 (e.g., the processor 420 of FIGS. 5A to 5C) may be disposed on the first surface 711 of the second printed circuit board 710. According to another embodiment (not shown), the processor 720 may be disposed on the second surface 713 of the second printed circuit board 710. According to another embodiment (not shown), additional electrical components (not shown) (e.g., a thermistor) may be disposed on the first surface 711 of the second printed circuit board 710.

According to an embodiment, the memory 750 (e.g., the memory 450 of FIGS. 5A to 5C), the first power management module 760 (e.g., the first power management module 460 of FIGS. 5A to 5C), and/or the fourth electrical component 770 (e.g., application processor decapsulation) may be disposed on the second surface 713 of the second printed circuit board 710. According to another embodiment (not shown), at least one of the above-described electrical components 750, 760, and 770 may be disposed on the first surface 711 of the second printed circuit board 710. According to another embodiment (not shown), at least one of the above-described electrical components 750, 760, and 770 may be disposed on the third surface 512 or the fourth surface 513 of the first printed circuit board 511. According to another embodiment (not shown), additional electrical components (not shown) may be disposed on the second surface 713 of the second printed circuit board 710.

According to various embodiments, at least a portion of the shielding member 780 may be coupled to the first printed circuit board 511. According to an embodiment, the shielding member 780 may include a first shielding member 781 at least a portion of which is coupled to the fourth surface 513 of the first printed circuit board 511 and/or a second shielding member 782 at least a portion of which is coupled to the third surface 512 of the first printed circuit board 511.

According to an embodiment, at least a portion of the first shielding member 781, along with at least a portion of the first surface 711 of the second printed circuit board 710 and/or the fourth surface 513 of the first printed circuit board 511, may form the first shielding space 781e. At least a partial space of the first shielding space 781e may be occupied by, e.g., the processor 720 and/or the third electrical component 523.

According to some embodiment (not shown), at least a portion of the first shielding member 781 (e.g., the first shielding member 470 of FIGS. 5A to 5C) may be coupled to the first surface 711 of the second printed circuit board 710, the first shielding member 781 may form the first shielding space 781e between it and the first surface 711 of the second printed circuit board 710, at least a portion of the first shielding member 781 may be disposed in the receiving space 511a, at least a partial space of the first shielding space 781e may be occupied by the processor 720, and the first shielding member 781 may be defined and/or interpreted as a portion of the second printed circuit board 710.

According to an embodiment, at least a portion of the second shielding member 782, along with at least a portion of the second surface 713 of the second printed circuit board 710 and/or the third surface 512 of the first printed circuit board 511, may form the second shielding space 782e. At least a partial space of the second shielding space 782e may be occupied by, e.g., the first electrical component 521, the second electrical component 522, the memory 750, the first power management module 760, and/or the fourth electrical component 770.

According to some embodiment (not shown), at least a portion of the second shielding member 782 may be coupled to the second surface 713 of the second printed circuit board 710, the second shielding member 782 may form the second shielding space 782e between it and the second surface 713 of the second printed circuit board 710, at least a partial space of the second shielding space 782e may be occupied by the memory 750, the first power management module 760, and/or the fourth electrical component 770, and the second shielding member 782 may be defined and/or interpreted as a portion of the second printed circuit board 710.

According to an embodiment, at least a portion of the first shielding member 781 and/or the processor 720 may be disposed between the second printed circuit board 710 and the first shielding member (not shown) (e.g., the first supporting member 372 (e.g., front case) of FIG. 4). For example, at least a portion of the first shielding member 781 may face the first supporting member. According to an embodiment, the memory 750, the first power management module 760, the fourth electrical component 770, and/or at least a portion of the second shielding member 782 may be disposed between the second printed circuit board 710 and the second supporting member (not shown) (e.g., the second supporting member 375 (e.g., rear case) of FIG. 4). For example, at least a portion of the second shielding member 782 may face the second supporting member.

Figure 9A:
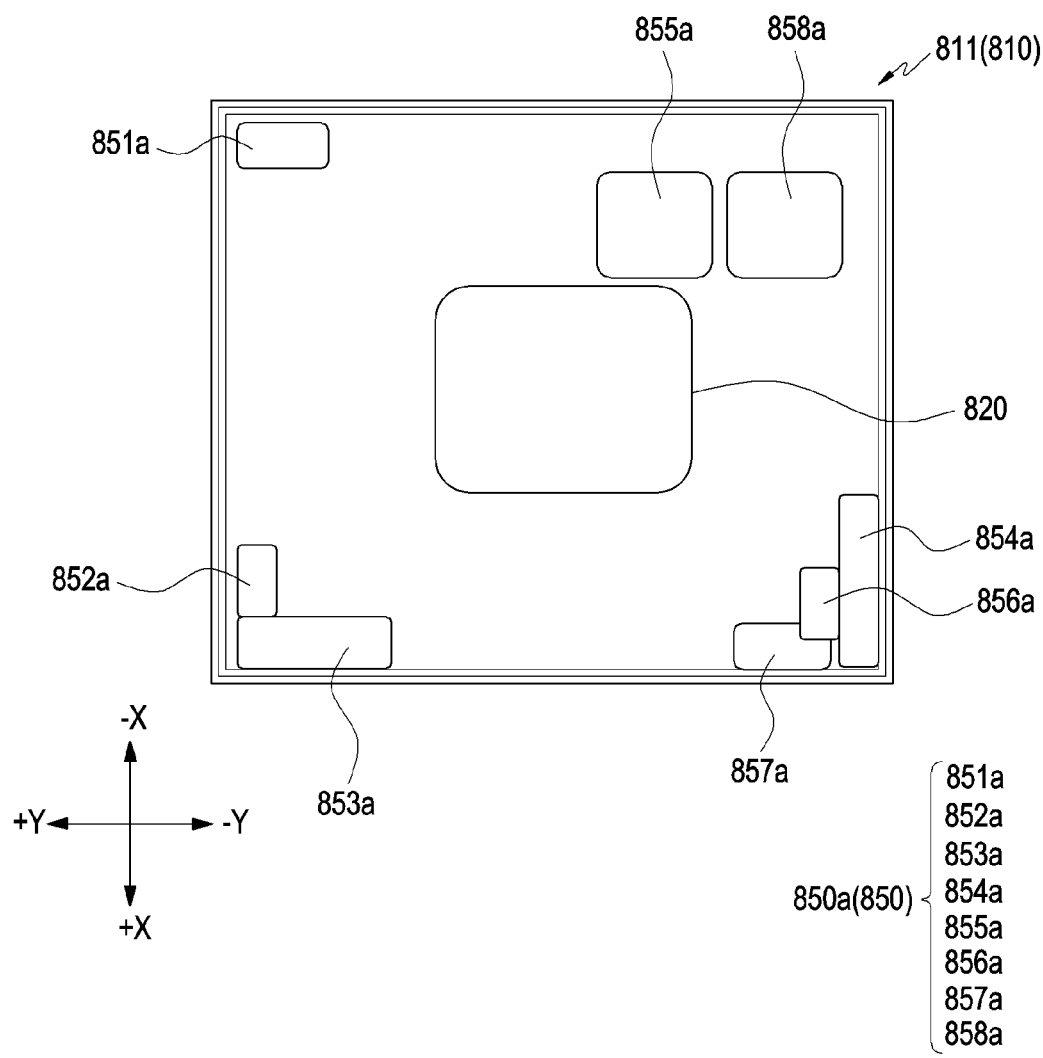
FIG. 9A is a view illustrating connection areas disposed on a front surface of a printed circuit board according to various example embodiments of the disclosure.

FIG. 9A is a view illustrating connection areas disposed on a front surface of a printed circuit board according to various embodiments of the disclosure. FIG. 9A is a view illustrating connection areas disposed on a rear surface of a printed circuit board according to various embodiments of the disclosure.

Figure 9B:
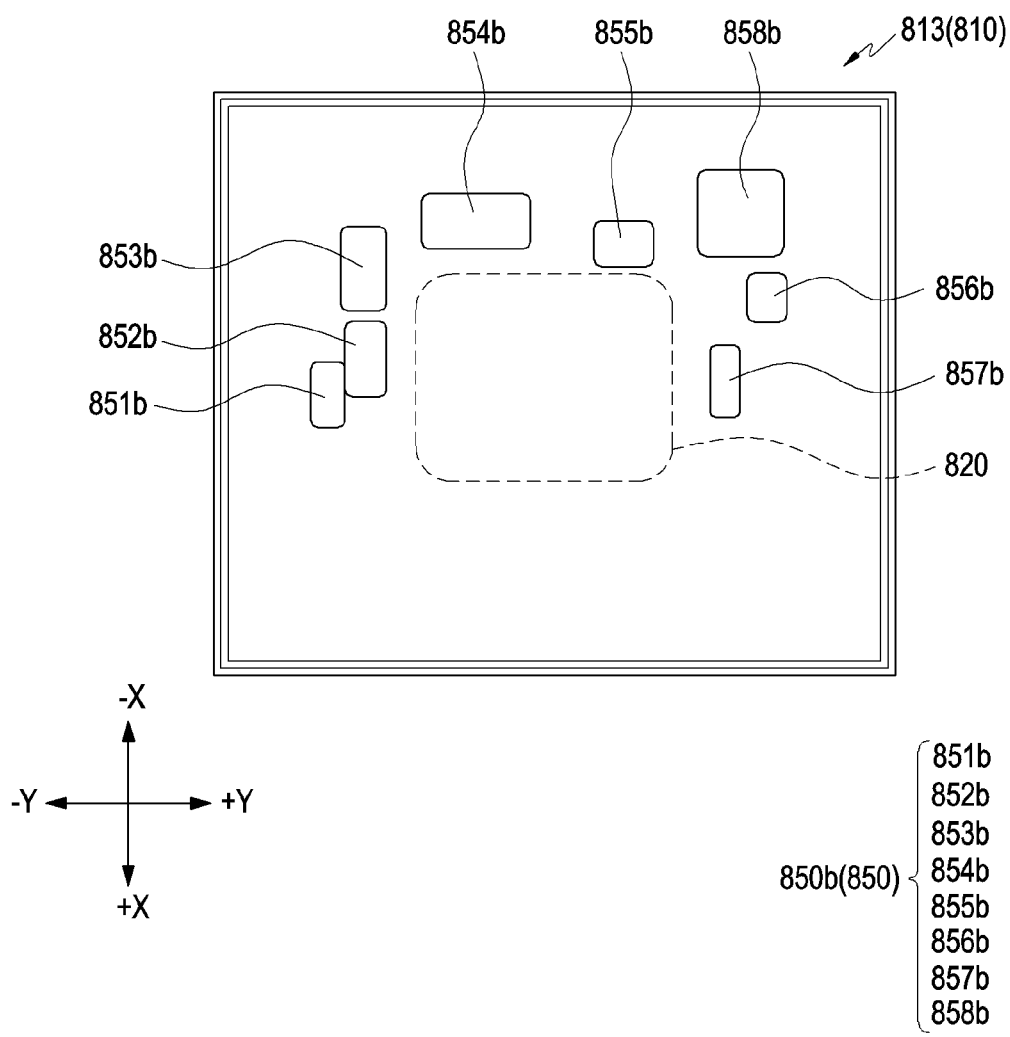
FIG. 9B is a view illustrating connection areas disposed on a rear surface of a printed circuit board according to various example embodiments of the disclosure.

Referring to FIGS. 9A and 9B, the printed circuit board 810 may include a printed circuit board 810 including a first surface 811 and a second surface 813, a processor 820 and/or a connection area 850.

The configuration of the printed circuit board 810, the first surface 811, the second surface 813, and/or the processor 820 of FIGS. 9A and 9B may be identical in whole or part to the configuration of the second printed circuit boards 610 and 710, the first surface 611 and 711, the second surfaces 613 and 713, and/or the processors 620 and 720 of FIGS. 7 and 8.

According to various embodiments, the processor 820 (e.g., the processor 620 of FIG. 7 or the processor 720 of FIG. 8) may be disposed on the first surface 811 (e.g., the first surface 711 of FIG. 7 or the first surface 811 of FIG. 8) of the printed circuit board 810 (e.g., the second printed circuit board 610 of FIG. 7 or the second printed circuit board 710 of FIG. 8). According to an embodiment, the processor 820 may be disposed on an inner side of the first surface 811. For example, at least a portion of the processor 820 may not be disposed adjacent to the edge of the first surface 811. Each "processor herein" includes processing circuitry.

According to various embodiments, the connection area 850 may include a first connection area 850a formed on the first surface 811 and a second connection area 850b formed on the second surface 813.

According to various embodiments, the first connection area 850*a* may be electrically connected to the corresponding second connection area 850*b* through a via and/or a conductive line (not shown).

According to an embodiment, the first connection area 850*a* may be electrically and/or physically connected with pads (or connectors) (not shown) of another printed circuit board when the printed circuit board 810 is coupled with the other printed circuit board (not shown) (e.g., the first printed circuit board 511 of FIG. 7 or FIG. 8).

According to an embodiment, the second connection area 850*b* may be electrically and/or physically connected with pads (or connectors) (not shown) of electrical components (not shown). According to another embodiment (not shown), the second connection area 850*b* may be electrically connected with the electrical components (not shown) through separate cables (not shown).

According to various embodiments, the first connection area 850*a* may include a 1-1th connection area 851*a*, a 1-2th connection area 852*a*, a 1-3th connection area 853*a*, a 1-4th connection area 854*a*, a 1-5th connection area 855*a*, a 1-6th connection area 856*a*, a 1-7th connection area 857*a*, and/or a 1-8th connection area 858*a*. According to some embodiments (not shown), the printed circuit board 810 may omit at least one of the first connection areas 850*a* or, if necessary, may include an additional first connection area.

According to various embodiments, the second connection area 850*b* may include a 2-1th connection area 851*b*, a 2-2th connection area 852*b*, a 2-3th connection area 853*b*, a 2-4th connection area 854*b*, a 2-5th connection area 855*b*, a 2-6th connection area 856*b*, a 2-7th connection area 857*b*, and/or a 2-8th connection area 858*b*. According to some embodiments (not shown), the printed circuit board 810 may omit at least one of the second connection areas 850*b* or, if necessary, may include an additional second connection area.

According to an embodiment, the 1-1th connection area 851*a* may be electrically connected to the corresponding 2-1th connection area 851*b*. The 2-1th connection area 851*b* may be connected to an electrical component (not shown) (e.g., UFS), and the electrical component (e.g., UFS) may be electrically connected to another printed circuit board (not shown) connected with the printed circuit board 810 through the 2-1th connection area 851*b* and the 1-1th connection area 851*a*. According to an embodiment, the 1-1th connection area 851*a* may be disposed to be spaced apart from the processor 820 in the first direction (e.g., the +Y direction of FIGS. 9A and 9B) on the first surface 811, and the 2-1th connection area 851*b* may be disposed to be spaced apart from the processor 820 in the second direction (e.g., the −Y direction of FIGS. 9A and 9B) opposite to the first direction on the second surface 813. The 1-1th connection area 851*a* may be disposed to be inclined in the fourth direction (e.g., the −X direction of FIGS. 9A and 9B) on the first surface 811.

According to an embodiment, the 1-2th connection area 852*a* may be electrically connected to the corresponding 2-2th connection area 852*b*. The 2-2th connection area 852*b* may be connected to an electrical component (not shown) (e.g., USB 3.0), and the electrical component (e.g., USB 3.0) may be electrically connected to another printed circuit board (not shown) connected with the printed circuit board 810 through the 2-2th connection area 852*b* and the 1-2th connection area 852*a*. According to an embodiment, the 1-2th connection area 852*a* may be disposed to be spaced apart from the processor 820 in the first direction (e.g., the +Y direction of FIGS. 9A and 9B) on the first surface 811, and the 2-2th connection area 852*b* may be disposed to be spaced apart from the processor 820 in the second direction (e.g., the −Y direction of FIGS. 9A and 9B) on the second surface 813. The 1-2th connection area 852*a* may be disposed to be inclined in the fourth direction (e.g., the +X direction of FIGS. 9A and 9B), opposite to the third direction, on the first surface 811.

According to an embodiment, the 1-3th connection area 853*a* may be electrically connected to the corresponding 2-3th connection area 853*b*. The 2-3th connection area 853*b* may be connected to an electrical component (not shown) (e.g., PCIE2), and the electrical component (e.g., PCIE2) may be electrically connected to another printed circuit board (not shown) connected with the printed circuit board 810 through the 2-3th connection area 853*b* and the 1-3th connection area 853*a*. According to an embodiment, the 1-3th connection area 853*a* may be disposed to be spaced apart from the processor 820 in the first direction (e.g., the +Y direction of FIGS. 9A and 9B) on the first surface 811, and the 2-3 connection area 853*b* may be disposed to be spaced apart from the processor 820 in the second direction (e.g., the −Y direction of FIGS. 9A and 9B) on the second surface 813. The 1-3th connection area 853*a* may be disposed to be inclined in the third direction (e.g., the +X direction of FIGS. 9A and 9B) on the first surface 811.

According to an embodiment, the 1-4th connection area 854*a* may be electrically connected to the corresponding 2-4th connection area 854*b*. The 2-4th connection area 854*b* may be connected to an electrical component (not shown) (e.g., display), and the electrical component (e.g., display) may be electrically connected to another printed circuit board (not shown) connected with the printed circuit board 810 through the 2-4th connection area 854*b* and the 1-4th connection area 854*a*. According to an embodiment, the 1-4th connection area 854*a* may be disposed to be spaced apart from the processor 820 in the second direction (e.g., the −Y direction of FIGS. 9A and 9B) on the first surface 811, and the 2-4 connection area 854*b* may be disposed to be spaced apart from the processor 820 in the fourth direction (e.g., the −X direction of FIGS. 9A and 9B) on the second surface 813. The 1-4th connection area 854*a* may be disposed to be inclined in the third direction (e.g., the +X direction of FIGS. 9A and 9B) on the first surface 811.

According to an embodiment, the 1-5th connection area 855*a* may be electrically connected to the corresponding 2-5th connection area 855*b*. The 2-5th connection area 855*b* may be connected to an electrical component (not shown) (e.g., VTCAM), and the electrical component (e.g., VTCAM) may be electrically connected to another printed circuit board (not shown) connected with the printed circuit board 810 through the 2-5th connection area 855*b* and the 1-5th connection area 855*a*. According to an embodiment, the 1-5th connection area 855*a* may be disposed adjacent to the edge, facing in the fourth direction (e.g., the −Y direction of FIGS. 9A and 9B), of the processor 820 on the first surface 811, and the 2-5th connection area 855*b* may be disposed adjacent to the edge, facing in the fourth direction (e.g., the −X direction of FIGS. 9A and 9B), of the processor 820 on the second surface 813. The 1-5th connection area 855*a* may be disposed to be further inclined in the second direction (e.g., the −Y direction of FIGS. 9A to 9B) than the 2-5th connection area 855*b* on the printed circuit board 810.

According to an embodiment, the 1-6th connection area 856*a* may be electrically connected to the corresponding 2-6th connection area 856*b*. The 2-6th connection area 856*b* may be connected to an electrical component (not shown) (e.g., SDC), and the electrical component (e.g., SDC) may be electrically connected to another printed circuit board (not shown) connected with the printed circuit board 810 through the 2-6th connection area 856*b* and the 1-6th connection area 856*a*. According to an embodiment, the 1-6th connection area 856*a* may be disposed to be spaced apart from the processor 820 in the second direction (e.g., the −Y direction of FIGS. 9A and 9B) on the first surface 811, and the 2-6 connection area 856*b* may be disposed to be spaced apart from the processor 820 in the first direction (e.g., the +Y direction of FIGS. 9A and 9B) on the second surface 813. The 1-6th connection area 856*a* may be disposed to be inclined in the third direction (e.g., the +X direction of FIGS. 9A and 9B) on the first surface 811.

According to an embodiment, the 1-7th connection area 857*a* may be electrically connected to the corresponding 2-7th connection area 857*b*. The 2-7th connection area 857*b* may be connected to an electrical component (not shown) (e.g., PCIE0), and the electrical component (e.g., PCIE0) may be electrically connected to another printed circuit board (not shown) connected with the printed circuit board 810 through the 2-7th connection area 857*b* and the 1-7th connection area 857*a*. According to an embodiment, the 1-7th connection area 857*a* may be disposed to be spaced apart from the processor 820 in the second direction (e.g., the −Y direction of FIGS. 9A and 9B) on the first surface 811, and the 2-7 connection area 857*b* may be disposed to be spaced apart from the processor 820 in the first direction (e.g., the +Y direction of FIGS. 9A and 9B) on the second surface 813. The 1-7th connection area 857*a* may be disposed to be inclined in the third direction (e.g., the +X direction of FIGS. 9A and 9B) on the first surface 811.

According to an embodiment, the 1-8th connection area 858*a* may be electrically connected to the corresponding 2-8th connection area 858*b*. The 2-8th connection area 858*b* may be connected to an electrical component (not shown) (e.g., RCAM), and the electrical component (e.g., RCAM) may be electrically connected to another printed circuit board (not shown) connected with the printed circuit board 810 through the 2-8th connection area 858*b* and the 1-8th connection area 858*a*. According to an embodiment, the 1-8th connection area 858*a* may be disposed to be spaced apart from the processor 820 in the second direction (e.g., the −Y direction of FIGS. 9A and 9B) on the first surface 811, and the 2-8 connection area 858*b* may be disposed to be spaced apart from the processor 820 in the first direction (e.g., the +Y direction of FIGS. 9A and 9B) on the second surface 813. The 2-8th connection area 858*b* may be disposed to be further inclined in the third direction (e.g., the +X direction of FIGS. 9A to 9B) than the 1-8th connection area 858*a* on the printed circuit board 810.

According to various embodiments, the plurality of connection areas 850 of the printed circuit board 810 are not limited to the above-described arrangement, and design changes may be made thereto as necessary.

According to various embodiments, the plurality of connection areas 850 of the printed circuit board 810 may be electrically connected to the exemplified electrical components and may be electrically connected to other electrical components as necessary.

According to various embodiments, each of the plurality of first connection areas 850*a* of the printed circuit board 810 may be defined and/or interpreted as some of a plurality of pads (not shown) (e.g., the pads 412 of FIGS. 5A to 5B) or a combination thereof.

According to some embodiment (not shown), some of the plurality of first connection areas 850*a* of the printed circuit board 810 (e.g., the 1-5th connection area 855*a* and the 1-8th connection area 858*a*) may be defined and interpreted as one connection area.

Figure 10A:
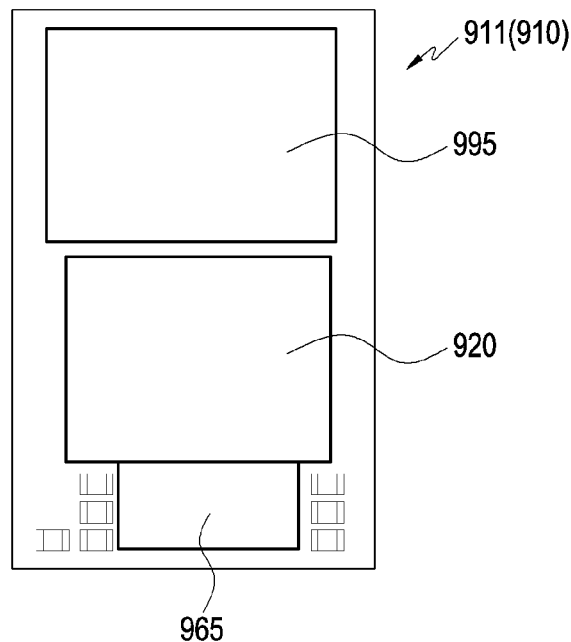
FIG. 10A is a view illustrating electrical components disposed on a front surface of a printed circuit board according to various example embodiments of the disclosure.
Figure 10B:
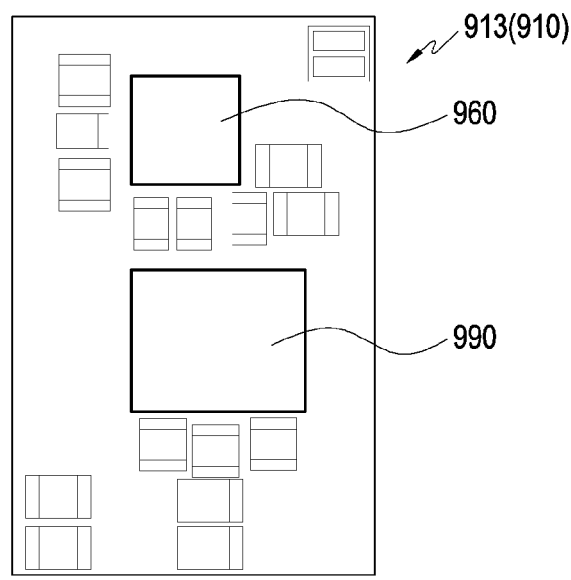
FIG. 10B is a view illustrating electrical components disposed on a rear surface of a printed circuit board according to various example embodiments of the disclosure.

FIG. 10A is a view illustrating electrical components disposed on a front surface of a printed circuit board according to various embodiments of the disclosure. FIG. 10B is a view illustrating electrical components disposed on a rear surface of a printed circuit board according to various embodiments of the disclosure.

Referring to FIGS. 10A to 10B, a printed circuit board 910 including a first surface 911 and a second surface 913 may include a processor 920, a first power management module 960, a second power management module 965, a fifth electrical component 990, and/or a sixth electrical component 995.

The configuration of the printed circuit board 910, the first surface 911, the second surface 913, the processor 920, and/or the first power management module 960 of FIGS. 10A and 10B may be identical in whole or part to the configuration of the second printed circuit boards 610 and 710, the first surface 611 and 711, the second surfaces 613 and 713, the processors 620 and 720, and/or the first power management modules 660 and 760 of FIGS. 7 and 8.

According to various embodiments, the processor 920 (e.g., the processor 620 of FIG. 7 or the processor 720 of FIG. 8) may be disposed on the first surface 911 (e.g., the first surface 611 of FIG. 7 or the first surface 711 of FIG. 8) of the printed circuit board 910 (e.g., the second printed circuit board 610 of FIG. 7 or the second printed circuit board 710 of FIG. 8). According to an embodiment, the processor 920 may be disposed on an inner side of the first surface 811. For example, at least a portion of the processor 920 may not be disposed adjacent to the edge of the first surface 911.

According to various embodiments, the second power management module 965 (e.g., the power management module 188 of FIG. 1) may be disposed on the first surface 911 (directly or indirectly on the first surface) of the printed circuit board 910. According to an embodiment, the second power management module 965 may be disposed adjacent to the processor 920. The second power management module 965 may manage the power supplied to, e.g., an electrical component (e.g., the processor 920) mounted on the first surface 911. The second power management module 965 is electrically connected to the electrical component mounted on the first surface 911, so that the electrical path with the electrical component is short, thus reducing the impedance between it and the electrical component. According to another embodiment, the second power management module 965 may manage the power supplied to the electrical component disposed on the second surface 913.

According to various embodiments, the sixth electrical component 995 may be disposed on the first surface 911 of the printed circuit board 910. According to an embodiment, the sixth electrical component 995 may be disposed adjacent to the processor 920 (e.g., see FIG. 10A). According to an embodiment, the sixth electrical component 995 may be disposed to be spaced apart from the processor 920 and/or the second power management module 965. In an embodiment, the sixth electrical component 995 may include at least one of a memory (e.g., the memory 130 of FIG. 1) or a passive component (e.g., application processor decapsulation).

According to various embodiments, the first power management module 960 (e.g., the first power management module 660 of FIG. 7 or the first power management module 760 of FIG. 8) may be disposed on the second surface 913

(e.g., the first surface 613 of FIG. 7 or the second surface 713 of FIG. 8) of the printed circuit board 910 (e.g., see FIG. 10B). The first power management module 960 may manage the power supplied to, e.g., an electrical component (e.g., the fifth electrical component 990) disposed on the second surface 913. The first power management module 960 is electrically connected to the electrical component mounted on the second surface 913, so that the electrical path with the electrical component is short, thus reducing the impedance between it and the electrical component. According to another embodiment, the first power management module 960 may manage the power supplied to the electrical component disposed on the first surface 911 and/or second surface 913.

According to various embodiments, the fifth electrical component 990 may be disposed on the second surface 913 of the printed circuit board 910. According to an embodiment, the fifth electrical component 990 may be disposed to be spaced apart from the first power management module 965. In an embodiment, the fifth electrical component 990 may include at least one of a memory (e.g., the memory 130 of FIG. 1) or a passive component (e.g., application processor decapsulation).

According to various embodiments of the disclosure, an electronic device (e.g., the electronic device 101 of FIG. 1) may comprise a housing (e.g., the housing 310 of FIGS. 2 and 3), a first printed circuit board (e.g., the first printed circuit board 341 of FIG. 4) being disposed in the housing and including a receiving space (e.g., the receiving space 341a of FIG. 4) formed in at least a portion thereof, and a second printed circuit board (e.g., the second printed circuit board 342 of FIG. 4 or the printed circuit board 410 of FIGS. 5A to 5C) being stacked (directly or indirectly) on at least a partial area of the first printed circuit board, the second printed circuit board including a first surface (e.g., the first surface 411 of FIG. 5A) including a plurality of pads (e.g., the plurality of pads 412 of FIG. 5A) configured to be electrically connected with the first printed circuit board and a second surface (e.g., the second surface 413 of FIGS. 5B and 5C) facing in a direction opposite to the first surface.

According to various embodiments, the electronic device may further comprise a processor (e.g., the processor 420 of FIG. 5A) disposed on the first surface, a first power management module (e.g., the first power management module 460 of FIG. 5C) disposed on the second surface (directly or indirectly on the second surface), and a shielding member (e.g., the first shielding member 470 of FIGS. 5B and 5C) surrounding at least one of the processor or the first power management module.

According to various embodiments, at least a portion of the processor may be disposed in the receiving space.

According to various embodiments, the receiving space (e.g., the receiving space 341a of FIG. 4) may be a hole penetrating from one surface of the first printed circuit board to another surface thereof.

According to various embodiments, the receiving space (e.g., the receiving space 341a of FIG. 4) may be a recess depressed from one surface of the first printed circuit board toward another surface thereof.

According to various embodiments, the electronic device may further comprise a temperature detection unit (e.g., the temperature detection unit 430 of FIG. 5A) disposed adjacent to the processor on the first surface.

According to various embodiments, the temperature detection unit may include a thermistor.

According to various embodiments, the electronic device may further comprise an electrical component (e.g., the second power management module 965 and/or sixth electrical component 995 of FIG. 10A) disposed on the first surface (directly or indirectly on the first surface).

According to various embodiments, the electrical component (e.g., the second power management module 965 and/or sixth electrical component 995 of FIG. 10A) may include at least one of a memory, a passive component, and a second power management module.

According to various embodiments, at least some of the plurality of pads (e.g., the plurality of pads 412 of FIG. 5A) may configure to be electrically connected with a ground layer of the first printed circuit board.

According to various embodiments, pads (e.g., the pads 412' of FIG. 5A) disposed along an edge of the second printed circuit board among the plurality of pads may configure to be electrically connected with the ground layer.

According to various embodiments, the shielding member may include a first shielding member (e.g., the first shielding member 681 of FIG. 7) surrounding the processor and a second shielding member (e.g., the second shielding member 682 of FIG. 7) surrounding the first power management module.

According to various embodiments, the electronic device may further comprise a resin member (or resin) (e.g., the resin member 440 of FIG. 5A) fixing the processor to the first printed circuit board.

According to various embodiments, the second printed circuit board (e.g., the second printed circuit board 342 of FIG. 4 or the second printed circuit board 515 of FIG. 6) may be larger in size than the receiving space (e.g., the receiving space 341a of FIG. 4 or the receiving space 511a of FIG. 6).

According to various embodiments, the shielding member may include a penetrating portion (e.g., the penetrating portion 470a of FIG. 5B) formed in at least a portion thereof.

According to various embodiments, a printed circuit board (e.g., the printed circuit board 410 of FIGS. 5A to 5C) may comprise a first surface (e.g., the first surface 411 of FIG. 5A) including a plurality of pads (e.g., the plurality of pads 412 of FIG. 5A) configured to be electrically connected with another printed circuit board (e.g., the first printed circuit board 341 of FIG. 4), a second surface (e.g., the second surface 413 of FIGS. 5B and 5C) facing in a direction opposite to the first surface, a processor (e.g., the processor 420 of FIG. 5A) being disposed on the first surface (directly or indirectly on the first surface), and a temperature detection unit (e.g., the temperature detection unit 430 of FIG. 5A) being disposed adjacent to the processor on the first surface, the temperature detection unit may include a first portion (e.g., the first portion 431 of FIG. 5A) and a second portion (e.g., the second portion 432 of FIG. 5A) disposed to be substantially perpendicular to the first portion, the second portion may be longer than the first portion, the second portion may be disposed in contact with the processor. Each "processor herein" includes processing circuitry.

According to various embodiments, the printed circuit board may further comprise a first power management module (e.g., the first power management module 460 of FIG. 5C) disposed on the second surface (directly or indirectly on the second surface), and a shielding member (e.g., the shielding member 470 of FIGS. 5B and 5C) surrounding the first power management module.

According to various embodiments, the printed circuit board may further comprise an electrical component (e.g., the memory 450 of FIG. 5C or the fourth electrical component 670 of FIG. 7) disposed on at least one of the first surface and the second surface.

According to various embodiments, the electrical component may include at least one of a memory and a passive component.

According to various embodiments, pads (e.g., the pads 412' of FIG. 5A) disposed along an edge of the printed circuit board among the plurality of pads may configure to be electrically connected with a ground layer of the another printed circuit board.

While the disclosure has been shown and described with reference to exemplary embodiments thereof, it will be apparent to those of ordinary skill in the art that various changes in form and detail may be made thereto without departing from the spirit and scope.

What is claimed is:

1. An electronic device comprising:
   a housing;
   a first printed circuit board disposed in the housing and including a receiving space formed in at least a portion thereof, wherein the first printed circuit board includes a third surface and a fourth surface facing in a direction opposite to the third surface;
   a second printed circuit board stacked on at least a partial area of the first printed circuit board, the second printed circuit board including a first surface including a plurality of pads configured to be electrically connected with the fourth surface of the first printed circuit board and a second surface facing in a direction opposite to the first surface;
   a processor disposed on the first surface of the second printed circuit board;
   a temperature detector disposed on the first surface of the second printed circuit board; and
   a shield can disposed on the first printed circuit board,
   wherein the receiving space is formed as an opening penetrating through the third surface and the fourth surface of the first printed circuit board, or a recess recessed from the fourth surface of the first printed circuit board,
   wherein at least a portion of the processor is received in the receiving space of the first printed circuit board,
   wherein the third surface of the first printed circuit board and the first surface of the second printed circuit board face the same direction,
   wherein the shield can, which is disposed on the third surface of the first printed circuit board, surrounds to cover the processor, which is disposed on the first surface of the second printed circuit board,
   wherein the plurality of pads is provided in a plurality of horizontal rows continuously formed along a first direction, the plurality of horizontal rows is continuously arranged along a second direction perpendicular to the first direction, and the plurality of pads included in the plurality of horizontal rows is disposed to be staggered with respect to the second direction, and
   wherein the temperature detector is disposed in contact with an edge of the processor.

2. The electronic device of claim 1, further comprising:
   a first power management module, including power management circuitry, disposed on the second surface of the second printed circuit board.

3. The electronic device of claim 2, wherein the shield can surrounds the processor, and
   wherein the electronic device further comprises another shield can at least partially surrounding the first power management module and disposed on the fourth surface of the first printed circuit board.

4. The electronic device of claim 2, further comprising a resin fixing the processor to the first printed circuit board.

5. The electronic device of claim 1, wherein the temperature detector includes a thermistor.

6. The electronic device of claim 1, further comprising an electrical component disposed on the first surface.

7. The electronic device of claim 6, wherein the electrical component includes at least one of a memory, a passive component, or a second power management module comprising power management circuitry.

8. The electronic device of claim 1, wherein at least some of the plurality of pads are configured to be electrically connected with a ground layer of the first printed circuit board.

9. The electronic device of claim 8, wherein pads disposed along an edge of the second printed circuit board are among the plurality of pads configured to be electrically connected with the ground layer.

10. The electronic device of claim 1, wherein the second printed circuit board is larger in size than the receiving space.

11. The electronic device of claim 1, wherein the shield can includes a penetrating portion formed in at least a portion thereof.

12. A printed circuit board comprising:
    a first surface including a plurality of pads configured to be electrically connected with another printed circuit board;
    a second surface facing a direction opposite to the first surface;
    a processor disposed on the first surface;
    a resin member covering a portion of an edge of the processor and at least a portion of the first surface, wherein the resin member secures the processor to the first surface; and
    a temperature detector disposed on the first surface,
    wherein the temperature detector includes a first portion and a second portion disposed to be substantially perpendicular to the first portion,
    wherein the second portion is longer than the first portion, and
    wherein the second portion is disposed adjacent to the processor,
    wherein the second portion of the temperature detector is disposed in contact with an edge of the processor,
    wherein the resin member is disposed to cover at least the portion of the edge of the processor except another portion, disposed adjacent to the temperature detector, of the edge of the processor, and
    wherein the plurality of pads is provided in a plurality of horizontal rows continuously formed along a first direction, the plurality of horizontal rows is continuously arranged along a second direction perpendicular to the first direction, and the plurality of pads included in the plurality of horizontal rows is disposed to be staggered with respect to the second direction.

13. The printed circuit board of claim 12, further comprising:
    a first power management module, comprising power management circuitry, disposed on the second surface; and
    a shielding member at least partially surrounding the first power management module.

14. The printed circuit board of claim 12, further comprising an electrical component disposed on at least one of the first surface or the second surface.

15. The printed circuit board of claim 14, wherein the electrical component includes at least one of a memory or a passive component.

16. The printed circuit board of claim 12, wherein pads disposed along an edge of the printed circuit board, among the plurality of pads, are configured to be electrically connected with a ground layer of the another printed circuit board.

17. An electronic device comprising:
a housing;
a first printed circuit board disposed in the housing and including a receiving space formed in at least a portion thereof, wherein the first printed circuit board includes a third surface and a fourth surface facing in a direction opposite to the third surface;
a second printed circuit board stacked on at least a partial area of the first printed circuit board, the second printed circuit board including a first surface including a plurality of pads configured to be electrically connected with the fourth surface of the first printed circuit board and a second surface facing in a direction opposite to the first surface;
a processor disposed on the first surface of the second printed circuit board;
a temperature detector disposed on the first surface of the second printed circuit board;
at least one electronic component disposed on the second surface of the second printed circuit board;
a first shield can disposed on the fourth surface of the first printed circuit board; and
a second shield can disposed on the third surface of the first printed circuit board,
wherein the receiving space is formed as an opening penetrating through the third surface and the fourth surface of the first printed circuit board, or a recess recessed from the fourth surface of the first printed circuit board,
wherein at least a portion of the processor is received in the receiving space of the first printed circuit board,
wherein the third surface of the first printed circuit board and the first surface of the second printed circuit board face the same direction,
wherein the second shield can, which is disposed on the third surface of the first printed circuit board, surrounds to cover the processor, which is disposed on the first surface of the second printed circuit board,
wherein the fourth surface of the first printed circuit board and the second surface of the second printed circuit board face the same direction,
wherein the first shield can, which is disposed on the fourth surface of the first printed circuit board, surrounds to cover the at least one electronic component, which is disposed on the second surface of the second printed circuit board,
wherein the plurality of pads is provided in a plurality of horizontal rows continuously formed along a first direction, the plurality of horizontal rows is continuously arranged along a second direction perpendicular to the first direction, and the plurality of pads included in the plurality of horizontal rows is disposed to be staggered with respect to the second direction, and
wherein the temperature detector is disposed in contact with an edge of the processor.

* * * * *